(12) United States Patent
Blaum et al.

(10) Patent No.: US 11,474,898 B2
(45) Date of Patent: Oct. 18, 2022

(54) MULTIPLE RESPONDER APPROACH TO SYSTEMS WITH DIFFERENT TYPES OF FAILURES

(71) Applicant: International Business Machines Corporation, Armonk, NY (US)

(72) Inventors: Mario Blaum, Los Gatos, CA (US); Steven Robert Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 17/115,929

(22) Filed: Dec. 9, 2020

(65) Prior Publication Data
US 2022/0179739 A1 Jun. 9, 2022

(51) Int. Cl.
*H03M 13/00* (2006.01)
*G06F 11/10* (2006.01)
*H03M 13/29* (2006.01)
*H03M 13/15* (2006.01)

(52) U.S. Cl.
CPC ....... *G06F 11/1068* (2013.01); *H03M 13/154* (2013.01); *H03M 13/2909* (2013.01)

(58) Field of Classification Search
CPC ............. G06F 11/1068; H03M 13/154; H03M 13/2909
See application file for complete search history.

(56) References Cited

U.S. PATENT DOCUMENTS

| | | | |
|---|---|---|---|
| 6,715,106 B1 * | 3/2004 | Mermelstein | G06F 11/0751 714/36 |
| 7,073,115 B2 | 7/2006 | English | |
| 7,350,126 B2 * | 3/2008 | Winograd | H03M 13/134 714/752 |
| 8,918,701 B2 | 12/2014 | Blaum | |
| 9,684,468 B2 * | 6/2017 | Fisher | G06F 3/0679 |
| 9,870,284 B2 | 1/2018 | Blaum | |
| 10,142,419 B2 | 11/2018 | Zhang | |
| 10,430,123 B2 | 10/2019 | Best | |
| 10,686,471 B2 * | 6/2020 | Shany | H03M 13/157 |

OTHER PUBLICATIONS

Balaji, S.B., "Erasure Codes for Distributed Storage: Tight Bounds and Matching Constructions", arXiv:1806.04474v1 [cs.IT] Jun. 12, 2018, 284 pages.

(Continued)

*Primary Examiner* — Esaw T Abraham
(74) *Attorney, Agent, or Firm* — Aaron N. Pontikos; Stephen R. Yoder

(57) ABSTRACT

A computer implemented method for recovering erased entries within a system of arrays includes identifying a system consisting of a plurality of arrays, wherein each array consists of m rows and n columns of entries, each entry is divided into p symbols consisting of a plurality of bits, protecting the m rows and n columns of entries in the system with an erasure-correcting code allowing the recovery of a number of erased entries in such rows and columns, detecting an erasure corresponding to an entry in the identified system, and, responsive to detecting an erasure, determining the value of the erased entry according to the p symbols of one or more non-erased entries.

20 Claims, 14 Drawing Sheets

(56) References Cited

OTHER PUBLICATIONS

Kralevska, Katina, "Applied Erasure Coding in Networks and Distributed Storage", arXiv:1803 01358v1 [cs.IT] Mar. 4, 2018, 88 pages.

Wang et al., "Rebuilding for Array Codes in Distributed Storage Systems", 2010 IEEE Globecom Workshops, IEEE, 7 pages.

Zhou et al., "Fast Erasure Coding for Data Storage: A Comprehensive Study of the Acceleration Techniques", ACM Transactions on Storage, vol. 16, No. 1, Article 7. Publication date: Mar. 2020, 24 pages.

Blaum et al., "Array Codes With Local Properties", IEEE Transactions on Information Theory, vol. 66, No. 6, Jun. 2020, pp. 3675-3690.

Blaum et al., "Expanded Blaum-Roth Codes With Efficient Encoding and Decoding Algorithms", IEEE Communications Letters, vol. 23, No. 6, Jun. 2019, pp. 954-957.

Blaum et al., "Extended Product and Integrated Interleaved Codes", IEEE Transactions on Information Theory, vol. 64, No. 3, Mar. 2018, pp. 1497-1513.

Blaum et al., "Partial MDS (PMDS) and Sector-Disk (SD) Codes that Tolerate the Erasure of Two Random Sectors", 2014 IEEE International Symposium on Information Theory, 5 pages.

Blaum et al., "Partial-MDS Codes and Their Application to RAID Type of Architectures", IEEE Transactions on Information Theory, vol. 59, No. 7, Jul. 2013, pp. 4510-4519.

Blaum et al., "New Array Codes for Multiple Phased Burst Correction," IEEE Transactions on Information Theory, vol. 39, No. 1, Jan. 1993, pp. 66-77.

Gibson, Garth Alan, "Redundant Disk Arrays: Reliable, Parallel Secondary Storage", Report UCB/CSD 91/613, Dec. 1990, Computer Science Division (EECS), University of California Berkeley, 266 pages.

Gopalan et al., "Explicit Maximally Recoverable Codes With Locality", IEEE Transactions on Information Theory, vol. 60, No. 9, Sep. 2014, pp. 5245-5256.

Huang et al., "Erasure Coding in Windows Azure Storage", 2012 USENIX Annual Technical Conference, Boston, Massachussetts, Jun. 2012, 12 pages.

Kamath et al., "Explicit MBR All-Symbol Locality Codes", arXiv: 1302.0744v2 [cs.IT] May 27, 2013, 8 pages.

Li et al., "STAIR Codes: A General Family of Erasure Codes for Tolerating Device and Sector Failures in Practical Storage Systems", 12th USENIX Conference on File and Storage Technologies (FAST'14), Santa Clara, CA, Feb. 17-20, 2014, 17 pages.

Papailiopoulos et al., "Locally Repairable Codes", IEEE Transactions on Information Theory, vol. 60, No. 10, Oct. 2014, pp. 5843-5855.

Plank et al., "Sector-Disk (SD) Erasure Codes for Mixed Failure Modes in RAID Systems", ACM Transactions on Storage, vol. 10, No. 1, Article 4, Publication date: Jan. 2014, DOI:http://dx.doi.org/10.1145/2560013, 17 pages.

Rawat et al., "Optimal Locally Repairable and Secure Codes for Distributed Storage Systems", IEEE Transactions on Information Theory, vol. 60, No. 1, Jan. 2014, pp. 212-236.

Sathiamoorthy et al., "XORing Elephants: Novel Erasure Codes for Big Data", arXiv: 1301.3791v1 [cs.IT] Jan. 16, 2013, 17 pages.

Tamo et al., "A Family of Optimal Locally Recoverable Codes", IEEE Transactions on Information Theory, vol. 60, No. 8, Aug. 2014, pp. 4661-4676.

\* cited by examiner

FIG. 1C $$H^{(1)}_{m,n,\ell,p} = \begin{pmatrix} I_m \otimes \overbrace{(1\ 1\ \ldots\ 1)}^{n} \\ \hline \overbrace{(1\ 1\ \ldots\ 1)}^{m} \otimes I_n \\ \hline \left(1\ \alpha^{-1}\ \alpha^{-2}\ \ldots\ \alpha^{-(m-2)}\ 0\right) \otimes \left(I_\ell \otimes \left(1\ \alpha^{-1}\ \alpha^{-2}\ \ldots\ \alpha^{-(t-1)}\right)\right) \end{pmatrix} \quad (1)$$

FIG. 1D $$H_0 = \begin{pmatrix} 1 & 1 & 1 & 1 & 1 & 1 & 1 & 1 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline 1 & \alpha^4 & \alpha^3 & \alpha^2 & 0 & 0 & 0 & 0 \\ 0 & 0 & 0 & 0 & 1 & \alpha^4 & \alpha^3 & \alpha^2 \end{pmatrix}$$

$$H_2 = \begin{pmatrix} 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^3 & \alpha^2 & \alpha & 1 & 0 & 0 & 0 & 0 \\ 0 & 0 & 0 & 0 & \alpha^3 & \alpha^2 & \alpha & 1 \end{pmatrix}$$

$$H_1 = \begin{pmatrix} 0 & 0 & 0 & 0 & 0 & 0 & 0 & 0 \\ 1 & 1 & 1 & 1 & 1 & 1 & 1 & 1 \\ 0 & 0 & 0 & 0 & 0 & 0 & 0 & 0 \\ 0 & 0 & 0 & 0 & 0 & 0 & 0 & 0 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^4 & \alpha^3 & \alpha^2 & \alpha & 0 & 0 & 0 & 0 \\ 0 & 0 & 0 & 0 & \alpha^4 & \alpha^3 & \alpha^2 & \alpha \end{pmatrix}$$

$$H_3 = \begin{pmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline 0 & 0 & 0 & 0 & 0 & 0 & 0 & 0 \\ 0 & 0 & 0 & 0 & 0 & 0 & 0 & 0 \end{pmatrix}$$

FIG. 1E

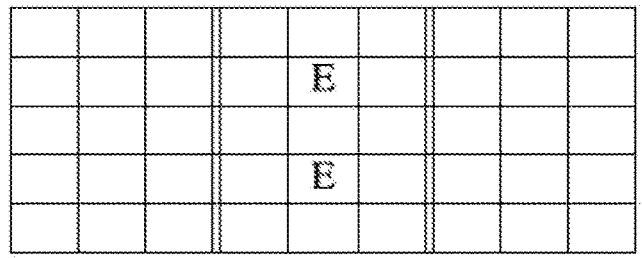

FIG. 2

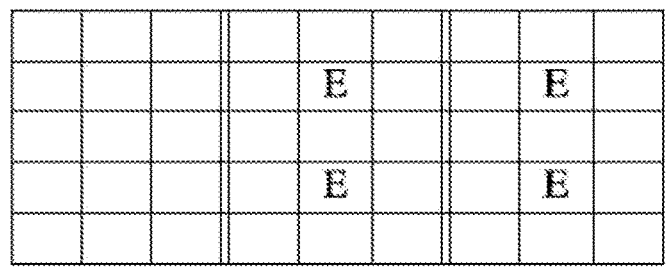

FIG. 3

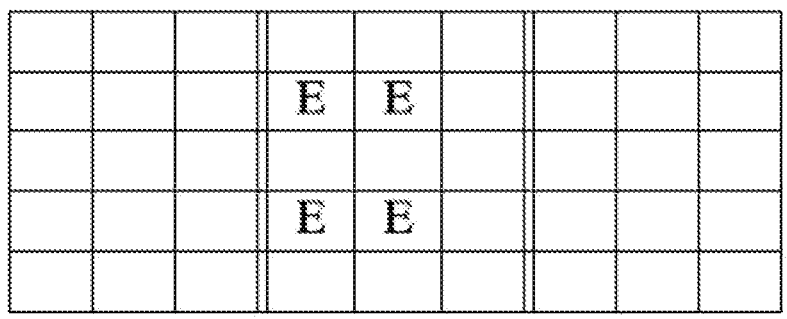

FIG. 4

$$\tilde{H}^{(1)}_{m,n,\ell,t} = \begin{pmatrix} I_m \otimes \overbrace{(1\ 1\ \ldots\ 1)}^{n} \\ \hline \overbrace{(1\ 1\ \ldots\ 1)}^{m} \otimes I_n \\ \hline \left(1\ \alpha^{-1}\ \alpha^{-2}\ \ldots\ \alpha^{-(m-1)}\right) \otimes \left(I_\ell \otimes \left(1\ \alpha^{-1}\ \alpha^{-2}\ \ldots\ \alpha^{-(t-1)}\right)\right) \end{pmatrix}$$

FIG. 5

$$\tilde{H}_3 = \begin{pmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 1 & 1 & 1 & 1 & 1 & 1 & 1 & 1 \\ \hline 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ \hline \alpha^2 & \alpha & 1 & \alpha^4 & 0 & 0 & 0 & 0 \\ 0 & 0 & 0 & 0 & \alpha^2 & \alpha & 1 & \alpha^4 \end{pmatrix}$$

$$H^{(2)}_{m,n,\ell,p} = \left( \begin{array}{c} I_m \otimes \begin{pmatrix} 1 & 1 & 1 & \cdots & 1 \\ 1 & \alpha & \alpha^2 & \cdots & \alpha^{n-1} \end{pmatrix} \\ \hline \overbrace{(1 \ 1 \ \cdots \ 1)}^{m} \otimes I_n \\ \hline \left( 1 \ \alpha^{-1} \ \alpha^{-2} \ \cdots \ \alpha^{-(m-2)} \ 0 \right) \otimes \left( I_\ell \otimes \left( 1 \ \alpha^{-1} \ \alpha^{-2} \ \cdots \ \alpha^{-(t-1)} \right) \right) \end{array} \right) \quad (25)$$

$$\tilde{H}^{(2)}_{m,n,\ell,p} = \left( \begin{array}{c} I_m \otimes \begin{pmatrix} 1 & 1 & 1 & \cdots & 1 \\ 1 & \alpha & \alpha^2 & \cdots & \alpha^{n-1} \end{pmatrix} \\ \hline \overbrace{(1\ 1\ \cdots\ 1)}^{m} \otimes I_n \\ \hline \left(1\ \alpha^{-1}\ \cdots\ \alpha^{-(m-2)}\ \alpha^{-(m-1)}\right) \otimes \left(I_\ell \otimes \left(1\ \alpha^{-1}\ \alpha^{-2}\ \cdots\ \alpha^{-(\ell-1)}\right)\right) \end{array} \right) \quad (60)$$

FIG. 11

$$\tilde{H}_3 = \begin{pmatrix}
0 & 0 & 0 & 0 & 0 & 0 & 0 & 0 & 0 & 0 \\
0 & 0 & 0 & 0 & 0 & 0 & 0 & 0 & 0 & 0 \\
0 & 0 & 0 & 0 & 0 & 0 & 0 & 0 & 0 & 0 \\
0 & 0 & 0 & 0 & 0 & 0 & 0 & 0 & 0 & 0 \\
0 & 0 & 0 & 0 & 0 & 0 & 0 & 0 & 0 & 0 \\
0 & 0 & 0 & 0 & 0 & 0 & 0 & 0 & 0 & 0 \\
1 & 1 & 1 & 1 & 1 & 1 & 1 & 1 & 1 & 1 \\
1 & \alpha & \alpha^2 & \alpha^3 & \alpha^4 & \alpha^5 & \alpha^6 & \alpha^7 & \alpha^8 & \alpha^9 \\
\hline
1 & 0 & 0 & 0 & 0 & 0 & 0 & 0 & 0 & 0 \\
0 & 1 & 0 & 0 & 0 & 0 & 0 & 0 & 0 & 0 \\
0 & 0 & 1 & 0 & 0 & 0 & 0 & 0 & 0 & 0 \\
0 & 0 & 0 & 1 & 0 & 0 & 0 & 0 & 0 & 0 \\
0 & 0 & 0 & 0 & 1 & 0 & 0 & 0 & 0 & 0 \\
0 & 0 & 0 & 0 & 0 & 1 & 0 & 0 & 0 & 0 \\
0 & 0 & 0 & 0 & 0 & 0 & 1 & 0 & 0 & 0 \\
0 & 0 & 0 & 0 & 0 & 0 & 0 & 1 & 0 & 0 \\
0 & 0 & 0 & 0 & 0 & 0 & 0 & 0 & 1 & 0 \\
0 & 0 & 0 & 0 & 0 & 0 & 0 & 0 & 0 & 1 \\
\hline
\alpha^8 & \alpha^7 & \alpha^6 & \alpha^5 & \alpha^4 & 0 & 0 & 0 & 0 & 0 \\
0 & 0 & 0 & 0 & 0 & \alpha^8 & \alpha^7 & \alpha^6 & \alpha^5 & \alpha^4
\end{pmatrix}$$

FIG. 12

$$H_{w,m,n,\ell,p} = \left( \begin{array}{c} I_w \otimes H^{(1)}_{m,n,\ell,p} \\ \hline \underbrace{(1\ 1\ 1\ \ldots\ 1)}_{w} \otimes \left( I_m \otimes \begin{pmatrix} 1 & \alpha & \alpha^2 & \ldots & \alpha^{n-1} \end{pmatrix} \right) \end{array} \right), \quad (61)$$

$$H_{3,3,8,2,11} = \begin{pmatrix} H^{(1)}_{3,8,2,11} & \underline{0}_{13,24} & \underline{0}_{13,24} \\ \underline{0}_{13,24} & H^{(1)}_{3,8,2,11} & \underline{0}_{13,24} \\ \underline{0}_{13,24} & \underline{0}_{13,24} & H^{(1)}_{3,8,2,11} \\ \hline H & H & H \end{pmatrix}$$

FIG. 15

$$\begin{pmatrix} 1 & \alpha & \alpha^2 & \alpha^3 & \alpha^4 & \alpha^5 & \alpha^6 & \alpha^7 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 1 & \alpha & \alpha^2 & \alpha^3 & \alpha^4 & \alpha^5 & \alpha^6 & \alpha^7 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 1 & \alpha & \alpha^2 & \alpha^3 & \alpha^4 & \alpha^5 & \alpha^6 & \alpha^7 \end{pmatrix}$$

FIG. 16

$$\tilde{H}_{w,m,n,\ell,p} = \left( \begin{array}{c} I_w \otimes \tilde{H}^{(1)}_{m,n,\ell,p} \\ \hline \overbrace{(1 \ 1 \ 1 \ \ldots \ 1)}^{w} \otimes (I_m \otimes (1 \ \alpha \ \alpha^2 \ \ldots \ \alpha^{n-1})) \end{array} \right). \quad (77)$$

FIG. 17

| 124541 | 116745 | 107595 | 0 | 93959 | 61563 | 96836 | 79204 | 115999 | 131072 |
|---|---|---|---|---|---|---|---|---|---|
| 108893 | 41349 | 101556 | 61563 | 3350 | 81657 | 112515 | 84718 | 56847 | 131072 |
| 61093 | 66373 | 44179 | 118876 | 73767 | 118876 | 92556 | 33511 | 52679 | 131072 |
| 6229 | 98722 | 5443 | 42766 | 52044 | 78831 | 96836 | 100137 | 9058 | 131072 |
| 39993 | 45645 | 101556 | 73115 | 131072 | 75436 | 69773 | 0 | 131072 | 131072 |
| 131072 | 131072 | 131072 | 131072 | 131072 | 131072 | 131072 | 131072 | 131072 | 131072 |

| 83960 | 33900 | 104951 | 33900 | 9705 | 33511 | 124541 | 54041 | 37167 | 131072 |
|---|---|---|---|---|---|---|---|---|---|
| 11892 | 110856 | 12458 | 0 | 10495 | 17597 | 52679 | 61093 | 115604 | 131072 |
| 7902 | 30977 | 27337 | 9058 | 124541 | 1675 | 113694 | 45645 | 29340 | 131072 |
| 112515 | 76730 | 101556 | 73767 | 69203 | 121793 | 77105 | 63216 | 42766 | 131072 |
| 13857 | 94681 | 72464 | 27337 | 131072 | 42766 | 72464 | 90641 | 131072 | 131072 |
| 131072 | 131072 | 131072 | 131072 | 131072 | 131072 | 131072 | 131072 | 131072 | 131072 |

| 78831 | 66373 | 50778 | 47568 | 46278 | 2973 | 36849 | 61093 | 131072 | 131072 |
|---|---|---|---|---|---|---|---|---|---|
| 113301 | 106364 | 61093 | 6229 | 124541 | 55428 | 115604 | 6229 | 131072 | 131072 |
| 9705 | 24916 | 50778 | 5064 | 110550 | 83960 | 29719 | 16950 | 131072 | 131072 |
| 2973 | 20256 | 90029 | 125803 | 61093 | 54041 | 110550 | 96082 | 131072 | 131072 |
| 79986 | 71174 | 126432 | 73767 | 131072 | 78831 | 44179 | 131072 | 131072 | 131072 |
| 131072 | 131072 | 131072 | 131072 | 131072 | 131072 | 131072 | 131072 | 131072 | 131072 |

FIG. 18

| 124541 | 116745 | 107595 | 0 | 93959 | 61563 | 96836 | 79204 | 115999 | 106364 |
|---|---|---|---|---|---|---|---|---|---|
| 108893 | 41349 | 101556 | 61563 | 3350 | 81657 | 112515 | 84718 | 56847 | 91290 |
| 61093 | 66373 | 44179 | 118876 | 73767 | 118876 | 92556 | 33511 | 52679 | 83960 |
| 6229 | 98722 | 5443 | 42766 | 52044 | 78831 | 96836 | 100137 | 9058 | 3350 |
| 39993 | 45645 | 101556 | 73115 | 29719 | 75436 | 69773 | 0 | 9058 | 15159 |
| 9705 | 88358 | 73115 | 39602 | 64877 | 2973 | 118402 | 96836 | 78831 | 100927 |

| 83960 | 33900 | 104951 | 33900 | 9705 | 33511 | 124541 | 54041 | 37167 | 122186 |
|---|---|---|---|---|---|---|---|---|---|
| 11892 | 110856 | 12458 | 0 | 10495 | 17597 | 52679 | 61093 | 115604 | 9058 |
| 7902 | 30977 | 27337 | 9058 | 124541 | 1675 | 113694 | 45645 | 29340 | 45645 |
| 112515 | 76730 | 101556 | 73767 | 69203 | 121793 | 77105 | 63216 | 42766 | 104951 |
| 13857 | 94681 | 72464 | 27337 | 32243 | 42766 | 72464 | 90641 | 6229 | 36232 |
| 63216 | 71174 | 87088 | 126432 | 39115 | 113694 | 41349 | 72464 | 106364 | 22554 |

| 78831 | 66373 | 50778 | 47568 | 46278 | 2973 | 36849 | 61093 | 87625 | 116582 |
|---|---|---|---|---|---|---|---|---|---|
| 113301 | 106364 | 61093 | 6229 | 124541 | 55428 | 115604 | 6229 | 44179 | 39602 |
| 9705 | 24916 | 50778 | 5064 | 110550 | 83960 | 29719 | 16950 | 6229 | 22389 |
| 2973 | 20256 | 90029 | 125803 | 61093 | 54041 | 110550 | 96082 | 0 | 5443 |
| 79986 | 71174 | 126432 | 73767 | 125202 | 78831 | 44179 | 45108 | 46278 | 37167 |
| 106364 | 107595 | 23784 | 30977 | 129754 | 29719 | 15159 | 95136 | 87625 | 102093 |

FIG. 19

| 124541 | 116745 | 107595 | 0 | 93959 | 131072 | 131072 | 131072 | 115999 | 106364 |
| --- | --- | --- | --- | --- | --- | --- | --- | --- | --- |
| 108893 | 131072 | 101556 | 61563 | 3350 | 81657 | 112515 | 131072 | 56847 | 91290 |
| 61093 | 66373 | 44179 | 131072 | 131072 | 118876 | 92556 | 131072 | 131072 | 83960 |
| 6229 | 98722 | 5443 | 42766 | 52044 | 131072 | 96836 | 131072 | 9058 | 3350 |
| 131072 | 45645 | 101556 | 73115 | 29719 | 75436 | 69773 | 131072 | 30778 | 131072 |
| 9705 | 88358 | 131072 | 39602 | 131072 | 2973 | 118402 | 131072 | 78831 | 100927 |

| 83960 | 33900 | 131072 | 33900 | 131072 | 33511 | 131072 | 131072 | 37167 | 122186 |
| --- | --- | --- | --- | --- | --- | --- | --- | --- | --- |
| 11892 | 131072 | 12458 | 0 | 10495 | 17597 | 131072 | 131072 | 131072 | 131072 |
| 7902 | 30977 | 131072 | 9058 | 124541 | 1675 | 131072 | 131072 | 29340 | 45645 |
| 112515 | 76730 | 101556 | 73767 | 69203 | 131072 | 131072 | 131072 | 42766 | 131072 |
| 131072 | 94681 | 72464 | 27337 | 32243 | 42766 | 131072 | 131072 | 6229 | 36232 |
| 63216 | 71174 | 87088 | 131072 | 39115 | 113694 | 131072 | 131072 | 106364 | 22554 |

| 131072 | 66373 | 50778 | 47568 | 131072 | 2973 | 36849 | 61093 | 131072 | 131072 |
| --- | --- | --- | --- | --- | --- | --- | --- | --- | --- |
| 113301 | 106364 | 61093 | 131072 | 124541 | 55428 | 115604 | 6229 | 131072 | 39602 |
| 9705 | 24916 | 50778 | 5064 | 110550 | 83960 | 131072 | 16950 | 131072 | 22389 |
| 2973 | 131072 | 90029 | 125803 | 61093 | 54041 | 110550 | 96082 | 131072 | 131072 |
| 79986 | 71174 | 126432 | 73767 | 125202 | 131072 | 44179 | 45108 | 131072 | 37167 |
| 131072 | 107595 | 131072 | 30977 | 129754 | 29719 | 15159 | 131072 | 131072 | 102093 |

FIG. 20

| 243 | 228 | 210 | 0 | 183 | 120 | 189 | 154 | 226 | 207 |
| --- | --- | --- | --- | --- | --- | --- | --- | --- | --- |
| 212 | 80 | 198 | 120 | 6 | 159 | 219 | 165 | 111 | 178 |
| 119 | 129 | 86 | 232 | 144 | 232 | 180 | 65 | 102 | 163 |
| 12 | 192 | 10 | 83 | 101 | 153 | 189 | 195 | 17 | 6 |
| 78 | 89 | 198 | 142 | 58 | 147 | 136 | 0 | 99 | 29 |
| 18 | 172 | 142 | 77 | 126 | 5 | 231 | 189 | 153 | 197 |

| 163 | 66 | 204 | 66 | 18 | 65 | 243 | 105 | 72 | 238 |
| --- | --- | --- | --- | --- | --- | --- | --- | --- | --- |
| 23 | 216 | 24 | 0 | 20 | 34 | 102 | 119 | 225 | 17 |
| 15 | 60 | 53 | 17 | 243 | 3 | 222 | 89 | 57 | 89 |
| 219 | 149 | 198 | 144 | 135 | 237 | 150 | 123 | 83 | 204 |
| 27 | 184 | 141 | 53 | 62 | 83 | 141 | 177 | 12 | 70 |
| 123 | 139 | 170 | 246 | 76 | 222 | 80 | 141 | 207 | 44 |

| 153 | 129 | 99 | 92 | 90 | 5 | 71 | 119 | 171 | 227 |
| --- | --- | --- | --- | --- | --- | --- | --- | --- | --- |
| 221 | 207 | 119 | 12 | 243 | 108 | 225 | 12 | 86 | 77 |
| 18 | 48 | 99 | 9 | 215 | 163 | 58 | 33 | 12 | 43 |
| 5 | 39 | 175 | 245 | 119 | 105 | 215 | 187 | 0 | 10 |
| 156 | 139 | 246 | 144 | 244 | 153 | 86 | 88 | 90 | 72 |
| 207 | 210 | 46 | 60 | 253 | 58 | 29 | 185 | 171 | 199 |

FIG. 21

MULTIPLE RESPONDER APPROACH TO SYSTEMS WITH DIFFERENT TYPES OF FAILURES

BACKGROUND

The present invention relates generally to the field of data storage, and more specifically to retrieving erasures.

Erasure correcting codes combining local and global properties have arisen considerable interest in recent literature. In general, these codes extend RAID architectures in the following sense: in addition to the local parities allowing to retrieve one or more erasures in a row of an array, some global parities are introduced in such a way that a certain parameter like the minimum distance is optimized, or, more strongly, in case of a column failure (which may correspond to a whole storage device failure), a number of extra erasures corresponding to the number of global parities can be corrected, as in the case of PMDS codes.

The use of product codes, in which both horizontal and vertical parities are used, allows for the development of multiple responder approaches. If there is an array in which each column represents a storage device (like a solid state drive or SSD), and each symbol a sector or page in the storage device, a vertical code retrieves a failed sector or page. The first responder takes care of sector failures using the vertical parity only, that is, a sector failure is corrected within the device, the remaining devices are not invoked. An extra parity may cover a subset of the devices allowing for correction of more than one sector within the subset. The horizontal parities allow for correction of more sectors as well as whole device failures. The idea is to combine skillfully the parities in such a way that the correcting capability of the code is optimized.

A plurality of devices may be grouped in a rack or even a data center and is represented by an array of symbols, each column corresponding to a device. A plurality of racks or data centers is represented by a set of arrays. In this set of arrays, global parities spanning all the devices in all the racks or data centers will be incorporated. The global parities will allow for the recovery of two device failures in a rack or data center, provided that the remaining racks or data centers can be individually corrected without invoking other racks or data centers. This is called a hierarchical approach, and it is desirable to optimize the redundancy when designing it (for example, by maximizing the minimum distance).

SUMMARY

As disclosed herein, a computer implemented method for detecting incomplete writes across multiple replicas includes identifying a system consisting of a plurality of arrays, wherein each array consists of m rows and n columns of entries, each entry is divided into p symbols consisting of a plurality of bits, protecting the m rows and n columns of entries in the system with an erasure-correcting code allowing the recovery of a number of erased entries in such rows and columns, detecting an erasure corresponding to an entry in the identified system, and, responsive to detecting an erasure, determining the value of the erased entry according to the p symbols of one or more non-erased entries. A computer program product and computer system corresponding to the method are also disclosed.

BRIEF DESCRIPTION OF THE DRAWINGS

FIG. 1C illustrates a 15×8 array containing data, horizontal, vertical and local parities in accordance with at least one embodiment of the present invention;

FIG. 1D depicts a parity-check matrix in accordance with at least one embodiment of the present invention;

FIG. 1E depicts a set of matrices in accordance with at least one embodiment of the present invention;

FIG. 2 depicts an illustration of a proof of Lemma 4 for 5×9 arrays in accordance with at least one embodiment of the present invention;

FIG. 3 depicts an array containing 4 erasures in accordance with at least one embodiment of the present invention;

FIG. 4 depicts sample erasure locations in accordance with at least one embodiment of the present invention;

FIG. 5 depicts a parity-check matrix in accordance with at least one embodiment of the present invention;

FIG. 6 depicts a parity-check matrix in accordance with at least one embodiment of the present invention;

FIG. 7 depicts a 15×8 array containing data, two horizontal, vertical and local parities in accordance with at least one embodiment of the present invention;

FIG. 8 depicts a parity-check matrix in accordance with at least one embodiment of the present invention;

FIG. 9 depicts a set of matrices in accordance with at least one embodiment of the present invention;

FIG. 10 depicts sample erasure locations in accordance with at least one embodiment of the present invention;

FIG. 11 depicts a parity-check matrix in accordance with at least one embodiment of the present invention;

FIG. 12 depicts a parity-check matrix in accordance with at least one embodiment of the present invention;

FIG. 13 depicts a parity-check matrix in accordance with at least one embodiment of the present invention;

FIG. 14 depicts five 15×8 arrays, each containing data, horizontal, vertical and local parities and the last array, in addition, containing shared parities, in accordance with at least one embodiment of the present invention;

FIG. 15 depicts a matrix in accordance with at least one embodiment of the present invention;

FIG. 16 depicts a matrix in accordance with at least one embodiment of the present invention;

FIG. 17 depicts a parity-check matrix in accordance with at least one embodiment of the present invention;

FIG. 18 depicts three arrays containing data to be encoded in accordance with at least one embodiment of the present invention;

FIG. 19 depicts three encoded arrays corresponding to the data in FIG. 18 in accordance with at least one embodiment of the present invention;

FIG. 20 depicts three arrays with erasures corresponding to the array in FIG. 19 that can be decoded in accordance with at least one embodiment of the present invention;

FIG. 21 depicts three punctured arrays in accordance with at least one embodiment of the present invention;

DETAILED DESCRIPTION

As an example, assume that there is data to be encoded according to FIG. 14, where there are w=5 racks, each one containing n=8 storage devices and each storage device containing m=15 entries (for example, an entry may consist of a whole sector or page). In general, there will be many more than m sectors or pages in a storage device, but those sectors may be divided into sets of m sectors each, and each set is encoded independently from the other sets in the device. D represents the entries containing data, by V the entries containing vertical parity, which is the XOR of the 14 D entries in the column of the V parity, by L a local parity corresponding to a set of 4 consecutive columns, the L parity allowing to recover an extra erasure in such set of 4 consecutive columns in addition to the ones allowed by the vertical parities, the H entries giving an horizontal parity in the corresponding row of the array, and the S entries corresponding to parity that is shared horizontally among all the rows corresponding to S in the 5 arrays. Systems with a similar distribution of data and parity are known in literature. However, here it may be desirable to replace multiplications in a finite field by rotation of a symbol of length p, p a prime number, as done in Expanded Blaum-Roth codes.

Consider a product code such that each row and each column are encoded with single even parity. The code consists of m×n arrays. In addition, the columns are divided into $\ell$ sets consisting of t consecutive columns each, i.e., n= $\ell$ t. Each set contains an extra parity entry. The extra parity provides two things: firstly, when in a set of t consecutive columns, one of the columns has two erasures and the remaining columns at most one erasure each, such erasures are corrected invoking only the vertical parities and the extra parity entry. This is what is called a second responder approach, where the first responder is given by the vertical parities. Assume that each column corresponds to a device, or to a Just a Bunch of Disks (JBOD), an erased entry (which, from now on, we call an erasure) is corrected by invoking only the device or JBOD where the erasure has occurred, and not the whole array. For two erasures, the second responder corrects them by invoking at most a set of t consecutive devices or JBODs. Secondly, the parities corresponding to the second responder, will increase the minimum distance of the code. In effect, the product code has minimum distance 4, i.e., any 3 erasures will be corrected. The second responder parities will increase this minimum distance to 6, i.e., any 5 erasures will be corrected. FIG. 1C illustrates a 15×8 array with the data (D), the horizontal parities (H), the vertical parities (V) and the $\ell$ =2 second responder parities (L) corresponding to two sets of four t=4 consecutive columns each.

Figure 1A:
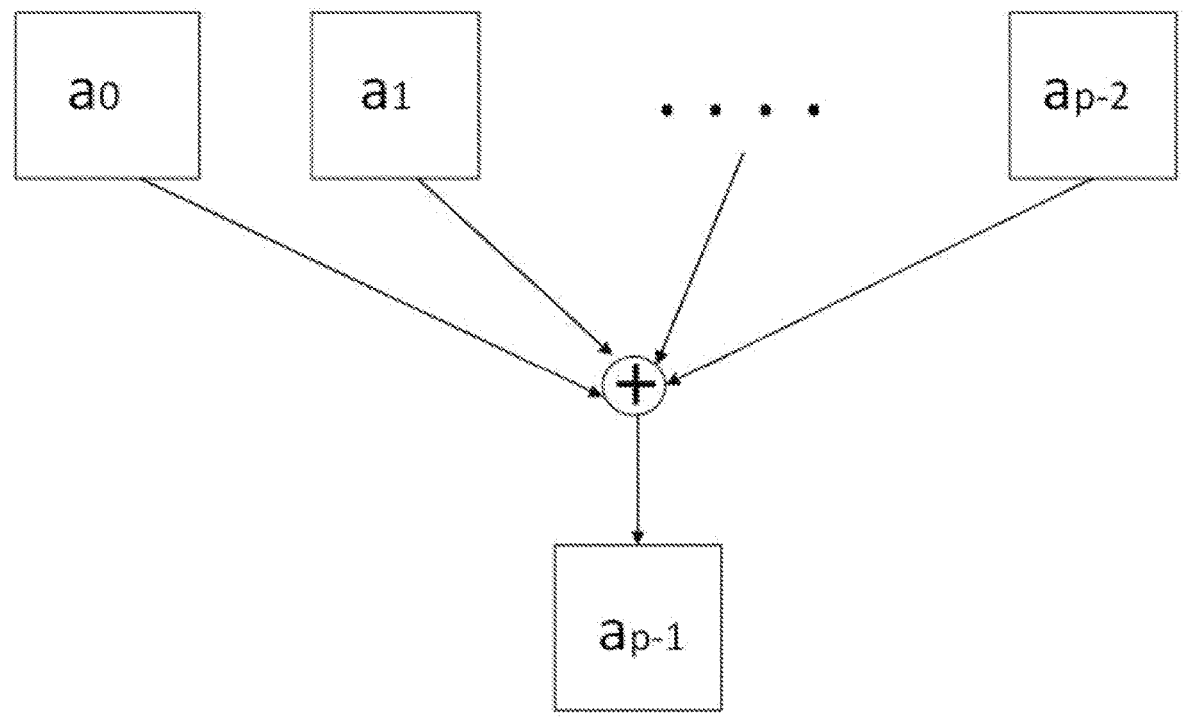
FIG. 1A illustrates an entry consisting of p symbols, wherein the last symbol is the XOR of the first p−1 symbols in accordance with at least one embodiment of the present invention.
Figure 1B:
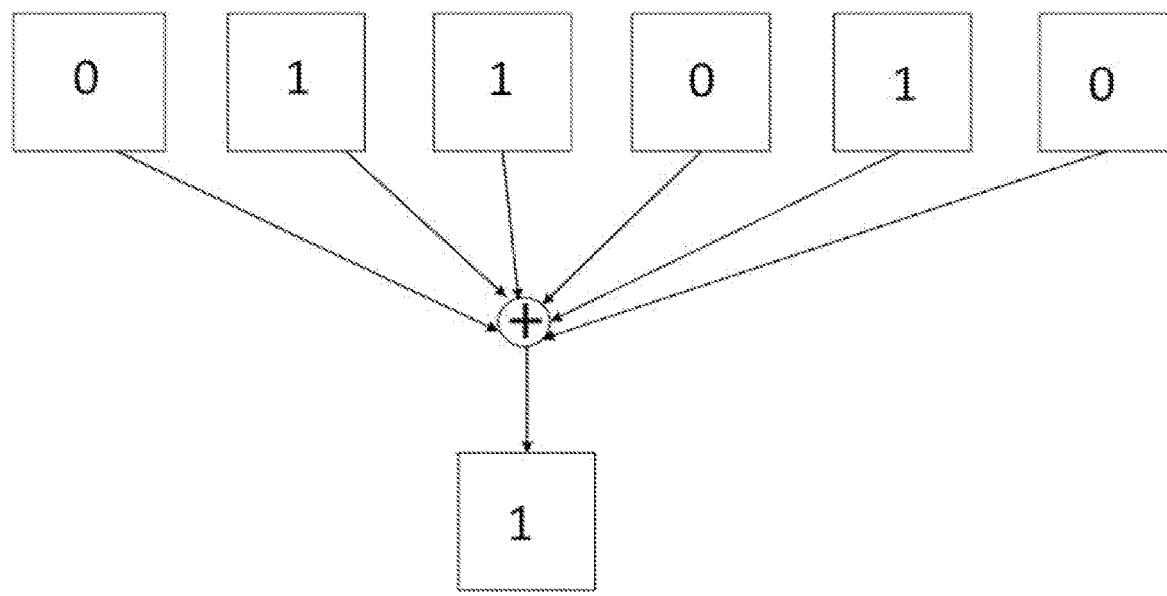
FIG. 1B illustrates an entry consisting of p=7 symbols, wherein the last symbol is the XOR of the first 6 symbols in accordance with at least one embodiment of the present invention.

Let p be a prime number and let $R_p$ be the ring of polynomials modulo $1 \oplus x^p$. Let $R_p^{(0)}$ be the ideal of polynomials in $R_p$ having even weight. Denote by $\alpha$ a rotation of a vector of length p, i.e., given a vector of length p $\underline{c}=(c_0, c_1, \ldots, c_{p-1})$, $\alpha \underline{c}=(c_{p-1}, c_0, c_1, \ldots, c_{p-2})$. Notice that $\alpha \in R_p$, $\alpha \neq 0$ and $\alpha^p=1$. In general, a vector $\underline{c}$ of length p is depicted as a polynomial in $\alpha$ in $R_p$, i.e., if $\underline{c}=(c_0, c_1, \ldots, c_{p-1})$, then $c(\alpha)=c_0 \oplus c_1 \alpha \oplus c_2 \alpha^2 \oplus \ldots \oplus c_{p-1} \alpha^{p-1}$. We will refer to a vector of length p as an entry, and each of the p components $c_i$ of an entry as a symbol. A symbol can be a single bit, a byte, or any other array of bits. The entries will be treated as either elements in the ring $R_p$, as vectors of length p or as polynomials in $\alpha$ of degree smaller than p, where these three representations of an entry are taken as synonyms. We will normally assume that the last symbol in an entry in $R_p^{(0)}$ is the XOR of the first p−1 symbols, as illustrated in FIG. 1A. while FIG. 1B illustrates the special case p=7.

We will next define the code over the ideal $R_p^{(0)}$ by giving an (m+n+ $\ell$ )×mn parity-check matrix over the ring $R_p$, where max{m−1, t}≤p. Denote by "$\oplus$" the Kronecker product between matrices. Let $C^{(1)}$(m, n, $\ell$, p) be the [mn, mn−m−n− $\ell$ +1] code whose parity-check matrix is depicted in FIG. 1D. The rows of $H^{(1)}_{m, n, \ell, p}$ are not linearly independent, we could eliminate one of the first m+n rows. However, its form is convenient and simple, so, we will keep it. We illustrate the construction with an example.

Example 1: Consider the ring $R_5$. Take 4×8 arrays, $\ell$ =2 and let $\alpha$ be a rotation in $R_5$. Then, according to FIG. 1D, the 14×32 parity-check matrix of code $C^{(1)}$(4, 8, 2, 5) is given by $H^{(1)}_{4, 8, 2, 5}=H_0 H_1 H_2 H_3$, wherein the corresponding matrices are depicted with respect to FIG. 1E. The following lemma gives a recursion that will be used in the decoding.

Lemma 2 Let $\underline{v}(\alpha)=\oplus_{i=0}^{p-1} v_i \alpha^i \in R_p^{(0)}$, where p is a prime number and $\alpha \in R_p$, $\alpha \neq 1$ and $\alpha^p=1$. For any integer u, denote by $\langle u \rangle_p$ the unique integer m such that $0 \leq m \leq p-1$ and m≡u (mod p) (when the context is clear, we will denote $\langle u \rangle_p$ simply as $\langle u \rangle$). Then, for each j such that $1 \leq j \leq p-1$, the recursion $(1 \oplus \alpha^j)\underline{z}(\alpha)=\underline{v}(\alpha)$ has a unique solution in $R_p^{(0)}$. Specifically, if $\underline{z}(\alpha)=\oplus_{i=0}^{p-1} z_i \alpha^i$, then $$\bigoplus_{u=1}^{(p-1)/2} v_{\langle 2uj \rangle} \quad (2)$$

$$z_{\langle ij \rangle} = z_{\langle (i-1)j \rangle} \oplus v_{\langle ij \rangle} \text{ for } 1 \leq i \leq p-1 \quad (3)$$

The following example illustrates Lemma 2:

Example 3: Let p=7, $\underline{v}(\alpha)=1 \oplus \alpha \oplus \alpha^4 \oplus \alpha^6 \in R_7^{(0)}$, i.e., $v_0=1$, $v_1=1$, $v_2=0$, $v_3=0$, $v_4=1$, $v_5=0$, and $v_6=1$. Assume that we want to solve the recursion $(1 \oplus \alpha^3)\underline{z}(\alpha)=\underline{v}(\alpha)$. According to (2) and (3), since j=3, $\langle 2j \rangle_7=6$, so $z_0 = v_6 \oplus v_{\langle 12 \rangle} \oplus v_{\langle 18 \rangle} = v_4 \oplus v_5 \oplus v_6 = 0$ $z_3 = z_0 \oplus v_3 = 0$ $z_6 = z_3 \oplus v_6 = 1$ $z_2 = z_6 \oplus v_2 = 1$ $z_5 = z_2 \oplus v_5 = 1$ $z_1 = z_5 \oplus v_1 = 0$ $z_4 = z_1 \oplus v_4 = 1$ so $\underline{z}(\alpha)=\alpha^2 \oplus \alpha^4 \oplus \alpha^5 \oplus \alpha^6$. In particular, we can see that $z \in R_7^{(0)}$.

The following lemma proves that if there are two erasures in a set of t consecutive columns, such erasures are corrected using only the vertical parity V and the parity L corresponding to such set.

Lemma 4. Consider an m×n array $a_{i,j}$ for ($0 \leq i \leq m-1$, $0 \leq j \leq m-1$) is a codeword of code $C^{(1)}$(m, n, $\ell$, p) defined by the parity-check matrix $H^{(1)}_{m, n, \ell, p, d}$ over $R_p^{(0)}$ as given by FIG. 1D. Assume that locations ($i_0$, r) and ($i_1$, r) have been erased, where $0 \leq i_0 \leq i_1 \leq m-1$ and either $st \leq r \leq (s+1)t-1$ for some $0 \leq s \leq \ell-2$ or $(\ell-1)t \leq r \leq \ell t-2$. Then, such locations can be retrieved by invoking only the vertical parity corresponding to column r and the parity corresponding to columns st, st+1, ..., (s+1)t−1 if $st \leq r \leq (s+1)t-1$ for some $0 \leq s \leq \ell-2$, or the parity corresponding to columns $(\ell-1)t$, $(\ell-1)t+1$, ..., $\ell t-2$ if $(\ell-1)t \leq r \leq \ell t-2$ Proof: The situation is illustrated in FIG. 2 for 5×9 arrays and $\ell=3$. Assume initially that the erasures are equal to zero, i.e., $a_{i0,r}=a_{i1,r}=0$. Using the parity-check matrix depicted in FIG. 1D, compute the syndromes $$S_r^{(V)} = \bigoplus_{i=0}^{m-1} a_{i,r} \tag{4}$$

$$S_s^{(L)} = \bigoplus_{i=0}^{m-2} \bigoplus_{j=0}^{t-1} \alpha^{-i-j} a_{i,st+j} \tag{5}$$

Assume first that $i_1 \leq m-2$. Then, we have to solve the system $$a_{i0,r} \oplus a_{i1,r} = S_r^{(V)}$$

$$\alpha^{-i0-(r-st)} a_{i0,r} \oplus \alpha^{-i1-(r-st)} a_{i1,r} = S_s^{(L)}$$

Solving the system, we obtain $$(1 \oplus \alpha^{p-(i1-i0)}) a_{i1,r} = S_r^{(V)} \oplus \alpha^{i0+r-st} S_s^{(L)}$$

This recursion can be solved using Lemma 2. Once the recursion is solved and $a_{i1,r}$ is obtained, $a_{i0,r}$ is obtained via $$a_{i0,r} = S_r^{(V)} \oplus a_{i1,r}$$

If $i_1 = m-1$, we have to solve the system $$a_{i0,r} \oplus a_{m-1,r} = S_r^{(V)}$$

$$\alpha^{-i0-(r-st)} a_{i0,r} = S_s^{(L)}$$

Hence, we obtain $a_{i0,r} = \alpha^{i0+r-st} S_s^{(L)}$ and $a_{m-1,r} = S_r^{(V)} \oplus a_{i0,r}$ The next theorem gives the minimum distance of code $C^{(1)}(m, n, \ell, p)$.

Theorem 5. The code $C^{(1)}(m, n, \ell, p)$ consisting of m×n arrays over $R_p^{(0)}$ whose parity-check matrix is given by FIG. 1D has minimum distance 6, where max $\{m-1, t\} \leq p$ and $n = \ell t$ Proof: One must prove that any 5 erasures are going to be corrected. Any row or column having exactly one erasure will be corrected by either the horizontal or the vertical parity, so we may assume that each column and row have either exactly two erasures or no erasures. Thus, we may assume that there are exactly 4 erasures with two rows and two columns having exactly two erasures each. If a set of t consecutive columns contains exactly two erasures, and the other two erasures are in a different set of t consecutive columns, as illustrated in FIG. 3, each set can correct the two erasures independently, as shown in Lemma 4, so the four erasures are correctable. So, assume that there are 4 erasures in the same set of t consecutive columns. Specifically, assume that such erasures are in locations $(i_0, j_0)$, $(i_0, j_1)$, $(i_1, j_0)$, $(i_1, j_1)$, where $0 \leq i_0 < i_1 \leq m-1$, $0 \leq j_0-st < j_1-st \leq t-1$ and $0 \leq s \leq \ell-1$, as illustrated in FIG. 4. Assuming that the erased entries are 0, start by computing the syndromes $$S_{i0}^{(H)} \bigoplus_{j=0}^{n-1} a_{i0,j}$$

$$S_{i1}^{(H)} \bigoplus_{j=0}^{n-1} a_{i1,j}$$

and $S_{j1}^{(V)}$ according to (4) and $S_s^{(L)}$ according to (5).

Assume first that $i_1 \leq m-2$. Then, solve the system $$a_{i0,j0} \oplus a_{i0,j1} = S_{i0}^{(H)} \tag{6}$$

$$a_{i1,j0} \oplus a_{i1,j1} = S_{i1}^{(H)} \tag{7}$$

$$a_{i0,j1} \oplus a_{i1,j1} = S_{j1}^{(H)} \tag{8}$$

$$\alpha^{-i0-(j0-st)} a_{i0,j0} \oplus \alpha^{-i0-(j1-st)} a_{i0,j1} \oplus \alpha^{-i1-(j0-st)} a_{i1,j0} \oplus \alpha^{-i1-(j1-st)} a_{i1,j1} = S_s^{(L)}$$

Multiplying both sides of the last equation by $\alpha^{i0+j0-st}$ yields $$a_{i0,j0} \oplus \alpha^{-(j1-j0)} a_{i0,j1} \oplus \alpha^{-(i1-i0)} a_{i1,j0} \oplus \alpha^{-(i1-i0)-(j1-j0)} a_{i1,j1} = \alpha^{i0+j0-st} S_s^{(L)} \tag{9}$$

XORing (6) and (9) gives $$(1 \oplus \alpha^{-(j1-j0)}) a_{i0,j1} \oplus \alpha^{-(i1-i0)} a_{i1,j0} \oplus \alpha^{-(i1-i0)-(j1-j0)} a_{i1,j1} = S_{i0}^{(H)} \oplus \alpha^{i0+j0-st} S_s^{(L)} \tag{10}$$

Multiplying (8) by $1 \oplus \alpha^{-(j1-j0)}$ and XORing it to (10) gives $$\alpha^{-(i1-i0)} a_{i1,j0} \oplus (1 \oplus \alpha^{-(j1-j0)} \oplus \alpha^{-(i1-i0)-(j1-j0)}) a_{i1,j1} = (1 \oplus \alpha^{-(j1-j0)}) S_s^{(L)} \tag{11}$$

Multiplying (7) by $\alpha^{-(i1-i0)}$ and XORing it to (11) gives $$(1 \oplus \alpha^{-(i1-i0)} \oplus \alpha^{-(j1-j0)} \oplus \alpha^{-(i1-i0)-(j1-j0)}) a_{i1,j1} = \alpha^{-(i1-i0)} S_{i1}^{(H)} \oplus (1 \oplus \alpha^{-(j1-j0)}) S_{j1}^{(V)} \oplus S_{i0}^{(H)} \oplus \alpha^{i0+j0-st} S_s^{(L)}$$

which becomes $$(1 \oplus \alpha^{-(i1-i0)})(1 \oplus \alpha^{-(j1-j0)}) a_{i1,j1} = \alpha^{-(i1-i0)} S_{i1}^{(H)} \oplus (1 \oplus \alpha^{-(j1-j0)}) S_{j1}^{(V)} \oplus S_{i0}^{(H)} \oplus \alpha^{i0+j0-st} S_s^{(L)} \tag{12}$$

Applying twice the recursion of Lemma 2 in 12 yields $a_{i1,j1}$. Then, by (7) $a_{i1,j0} = a_{i1,j1} \oplus S_{i1}^{(H)}$, by (8), $a_{i0,j1} = a_{i1,j1} \oplus S_{j1}^{(V)}$ and by (6), $a_{i0,j0} = a_{i0,j1} \oplus S_{i0}^{(H)}$, so the 4 erasures can be retrieved.

Assume next that $i_1 = m-1$. Then, using (1), the following system is solved:

$$a_{i0,j0} \oplus a_{i0,j1} = S_{i0}^{(H)} \tag{13}$$

$$a_{i1,j0} \oplus a_{m-1,j1} = S_{i1}^{(H)} \tag{14}$$

$$a_{i0,j1} \oplus a_{m-1,j1} = S_{j1}^{(V)} \tag{15}$$

$$\alpha^{-i0-(j0-st)} a_{i0,j0} \oplus \alpha^{-i0-(j1-st)} a_{i0,j1} = S_s^{(L)}$$

Multiplying both sides of the last equation by $\alpha^{i0+j0-st}$, it becomes $$a_{i0,j1} \oplus \alpha^{-(j1-j0)} a_{i0,j1} = \alpha^{i0+j0-st} S_s^{(L)} \tag{16}$$

XORing (13) and (16) gives $$(1 \oplus \alpha^{-(j1-j0)}) a_{i0,j1} = S_{i0}^{(H)} \oplus \alpha^{i0+j0-st} S_s^{(L)} \tag{17}$$

Solving the recursion of Lemma 2 in (17) yields $a_{i0,j1}$. Equation (15) yields $a_{m-1,j1} = a_{i0,j1} \oplus S_{j1}^{(V)}$; Equation 14 yields $a_{i1,j0} = a_{m-1,j1} \oplus S_{i1}^{(H)}$; Equation 13 yields $a_{i0,j0} = a_{i0,j1} \oplus S_{i0}^{(H)}$, completing the recovery of the 4 erasures.

A modification of code $C^{(1)}(m, n, \ell, p)$ may also be useful. Said code may be defined as $C'^{(1)}(m, n, \ell, p)$ by giving an (m+n+$\ell$)×mn parity-check matrix over the ideal $R_p^{(0)}$, where now max$\{m,t\} \leq p$. Explicitly, the parity-check matrix of the [mn, mn−m−n−$\ell$+1] is depicted in FIG. 5.

Matrices $H_{m,n,\ell,p}^{(1)}$ and $H'_{m,n,\ell,p}^{(1)}$ are very similar, and $H'_{m,n,\ell,p}^{(1)}$ has a more symmetric form. However, in some cases the use of code $C^{(1)}(m, n, \ell, p)$ may be preferable since it may require a smaller ring.

For example, assume that m=8, n=12, and $\ell$=3. Code $C^{(1)}(8, 12, 3, p)$ requires a ring $R_p$ satisfying max{m−1, t}=7≤p, while code $C'^{(1)}(8, 12, 3, p)$ requires a ring $R_p$ satisfying max{m,t}=8≤p. Thus, $C^{(1)}(8, 12, 3, p)$ can be constructed using the ring $R_7$, but a ring with a larger value of p, such as $R_{11}$, is required to construct $C'^{(1)}(8, 12, 3, p)$. Consider the following example to illustrate the construction of $C'^{(1)}(m, n, \ell, p)$.

Example 6. Consider the ring $R_7$ and, as in Example 1, take 4×8 arrays, $\ell$=2 and let $\alpha^7$=1, $\alpha$≠1. Then, according to (18), the 14×32 parity-check matrix of code $C'^{(1)}(4, 8, 2, 5)$ is given by $H'^{(1)}_{4, 8, 2, 5} = (H_0 H_1 H_2 H'_3)$, where $H_0$, $H_1$, and $H_2$ are the same as in Example 1, and $H'_3$ is given in FIG. 6.

The following theorem corresponding to $C'^{(1)}(m, n, \ell, p)$ is similar to theorem 5.

Theorem 7: The code $C'^{(1)}(m, n, \ell, p)$, consisting of m×n arrays over $R_p^{(0)}$ whose parity-check matrix is depicted in FIG. 5 has minimum distance 6, where max{m,t}≤p and n= $\ell$ t.

The following algorithm functions as a decoding algorithm for code $C'^{(1)}(m, n, \ell, p)$. Algorithm 8 (Decoding Algorithm for code $C'^{(1)}(m, n, \ell, p)$): Consider code $C'^{(1)}(m, n, \ell, p)$. Assume that an array $(a_{i,j})$ for 0≤i≤m−1, 0≤j≤n−1 in $C'^{(1)}(m, n, \ell, p)$ is received, possibly containing erasures. If there are no erasures, then output $(a_{i,j})$ for 0≤i≤m−1, 0≤j≤n−1 and go to EXIT, otherwise make j←0, u←0 and c←mn FIRST RESPONDER: If the number of erasures in entries $a_{i,j}$, 0≤i≤m−1, is different from one, then go to NEXT1. Otherwise, assuming that entry $a_{i0,j}$ has been erased, make $$a_{i0,j} \bigoplus_{\substack{i=0 \\ i \neq i0}}^{m-1} a_{i,j}$$

NEXT1: Make j←j+1. If j<n then go to FIRST RESPONDER. If j=n and there are no erasures left, then output $(a_{i,j})$ for 0≤i≤m−1, 0≤j≤n−1 and go to EXIT. Otherwise make u←0.

SECOND RESPONDER: If there are either no erasures or more than two erasures in columns ut+j, 0≤j≤t−1, then go to NEXT2. Otherwise, assume that there are two erasures in entries $a_{i0,ut+j0}$ and $a_{i1,ut+j0}$, where 0≤$i_0$<$i_1$≤n−1 and 0≤$j_0$≤t−1, and the remaining entries $a_{i,ut+j}$ are erasure free. Assuming $a_{i0,ut+j0}$=0 and $a_{i1,ut+j0}$=0, compute the syndromes $$S_{u,j0}^{(V)} = \bigoplus_{i=0}^{m-1} a_{i,ut+j0} \quad (19)$$

$$S_u^{(L)} = \bigoplus_{i=0}^{m-2}\bigoplus_{j=0}^{t-1} \alpha^{-i-j} a_{i,ut+j} \quad (20)$$

If $i_1$<m−1, then obtain $a_{i1,ut+j0}$ by solving the recursion $$(1 \oplus \alpha^{i1-i0})a_{i1,ut=j0}=\alpha^{i1-i0}S_{u,j0}^{(V)} \oplus \alpha^{i1+j0}S_u^{(L)}$$

given by Lemma 2, and then obtain $a_{i0,ut+j0}$ as $$a_{i0,ut+j0}=a_{i1,ut+j0} \oplus S_{u,j0}^{(V)}$$

while if $i_1$=m−1, make $$a_{i0,ut+j0}=\alpha^{i0+j0}S_u^{(L)}$$

$$a_{m-1,ut+j0}=a_{i0,ut+j0} \oplus S_{u,j0}^{(V)}$$

NEXT2: Make u←u+1. If u<$\ell$ then go to SECOND RESPONDER. If u=$\ell$ and there are no erasures left, then output $(a_{i,j})$ for 0≤i≤m−1, 0≤j≤n−1 and go to EXIT. Otherwise, make i←0 and go to THIRD RESPONDER.

THIRD RESPONDER: If row i has either no erasures or more than one erasure, then go to NEXT3. Otherwise, assume that the erasure occurred in location $a_{i,js}$, where 0≤$j_s$≤n−1, and make $$a_{i,js} \bigoplus_{\substack{j=0 \\ j \neq js}}^{n-1} a_{i,j}$$

NEXT3: Make i←i+1. If i<m then go to THIRD RESPONDER. Otherwise, if there are no more erasures, then output $(a_{i,j})$ for 0≤i≤m−1, 0≤j≤n−1 and go to EXIT. If there are erasures left, let $c_0$ be the number of such erasures. If $c_0$<c, then make c←$c_0$, j←0 and go to FIRST RESPONDER. Otherwise, if $c_0$≠4, then declare an uncorrectable erasure pattern and go to EXIT.

FOURTH RESPONDER: Assume that the erasures occurred in locations $a_{i0,ut+j0}$, $a_{i0,ut+j1}$, $a_{i1,ut+j1}$ and $a_{i1,ut+j1}$, where 0≤$i_0$<$i_1$≤m−1, 0≤u≤s−1 and 0≤$j_0$<$j_1$≤t−1. Making these locations equal to zero, compute the syndromes $$S_{i0}^{(H)} = \bigoplus_{j=0}^{n-1} a_{i0,j} \quad (21)$$

$$S_{i1}^{(H)} = \bigoplus_{j=0}^{n-1} a_{i1,j} \quad (22)$$

$$S_{u,j1}^{(V)} = \bigoplus_{i=0}^{m-1} a_{i,ut+j1} \quad (23)$$

$$S_L^{(L)} = \bigoplus_{i=0}^{m-2}\bigoplus_{j=0}^{t-1} \alpha^{-i-j} a_{i,ut+j} \quad (24)$$

If $i_1$<m−1, then obtain $a_{i1,ut+j1}$ by solving the double recursion $$(1 \oplus \alpha^{-(i1-i0)})(1 \oplus \alpha^{-(j1-j0)}) a_{i1,ut+j1} = \alpha^{-(i1-i0)}S_{i1}^{(H)} \oplus (1 \oplus \alpha^{-(j1-j0)})S_{U,j1}^{(V)} \oplus S_{i0}^{(H)} \oplus \alpha^{i0+j0}S_u^{(L)}$$

by applying Lemma 2, and then obtain $$a_{i1,ut+j0}=a_{i1,ut+j1} \oplus S_{i1}^{(H)}$$

$$a_{i0,ut+j1}=a_{i1,ut+j1} \oplus S_{u,j1}^{(V)}$$

$$a_{i0,ut+j0}=a_{i0,ut+j1} \oplus S_{i0}^{(H)}$$

output $(a_{i,j})$ for 0≤i≤m−1, 0≤j≤n−1, and go to EXIT, while, if $i_1$=m−1, then obtain $a_{i0,ut+j1}$ by solving the recursion $$(1 \oplus \alpha^{-(j1-j0)})a_{i0,ut+j1}=S_{i0}^{(H)} \oplus \alpha^{i0+j0}S_u^{(L)}$$

again by applying Lemma 2, and then obtain $$a_{i0,ut+j0}=a_{i0,ut+j1} \oplus S_{i0}^{(H)}$$

$$a_{i1,ut+j1}=a_{i0,ut+j1} \oplus S_{u,j1}^{(V)}$$

$$a_{i1,ut+j0}=a_{i1,ut+j1} \oplus S_{i1}^{(H)}$$

Output $(a_{a,j})$ for 0≤i≤m−1, 0≤j≤n−1; EXIT.

III. Product Code with Vertical Parity, Two Horizontal Parities and Extra Parity in Groups of Columns Consider a code consisting of m×n arrays with n=$\ell$ t such that:
1) Each row corresponds to a (shortened) [n, n−2, 3] Extended Blaum-Roth code EBR (p, 2), where p>n, (i.e., each row can correct up to two erasures).

2) Each column corresponds to an [n, n−1, 2] code (i.e., each column can correct one erasure).

3) Dividing the columns into $\ell$ sets of t consecutive columns, each set has an extra parity allowing for the correction of any two erasures within the set of t consecutive columns.

Such a code, when the entries are considered row-wise, is an [mn, mn (2m+n+$\ell$ −2)] code. The code is illustrated in FIG. 7 for m=15, n=8 and $\ell$ =2, giving a [120, 82] code. The idea is to construct a code maximizing the minimum distance. We will show a construction giving a minimum distance equal to 8. We will next define the code by giving an (m+2n+$\ell$)×mn parity-check matrix over the ring $R_p$, where max{m−1, n}≤p. As stated, the code consists of m×n arrays. Again, $\alpha$ denotes a rotation modulo p. Let $C^{(2)}$(m, n, $\ell$, p) be the [mn, mn−2m−n−$\ell$ +2] code over the ideal $R_p^{(0)}$ whose parity-check matrix is the (m+2n+$\ell$)×mn matrix depicted in FIG. 8.

The first 2m+n rows of $H_{m,n,\ell,p}^{(2)}$ are linearly dependent. In fact, we can delete two of the rows to make the matrix linearly independent, but like in the previous section, it is convenient to keep the definition given by FIG. 8. The construction is illustrated by the below example.

Figure 9:
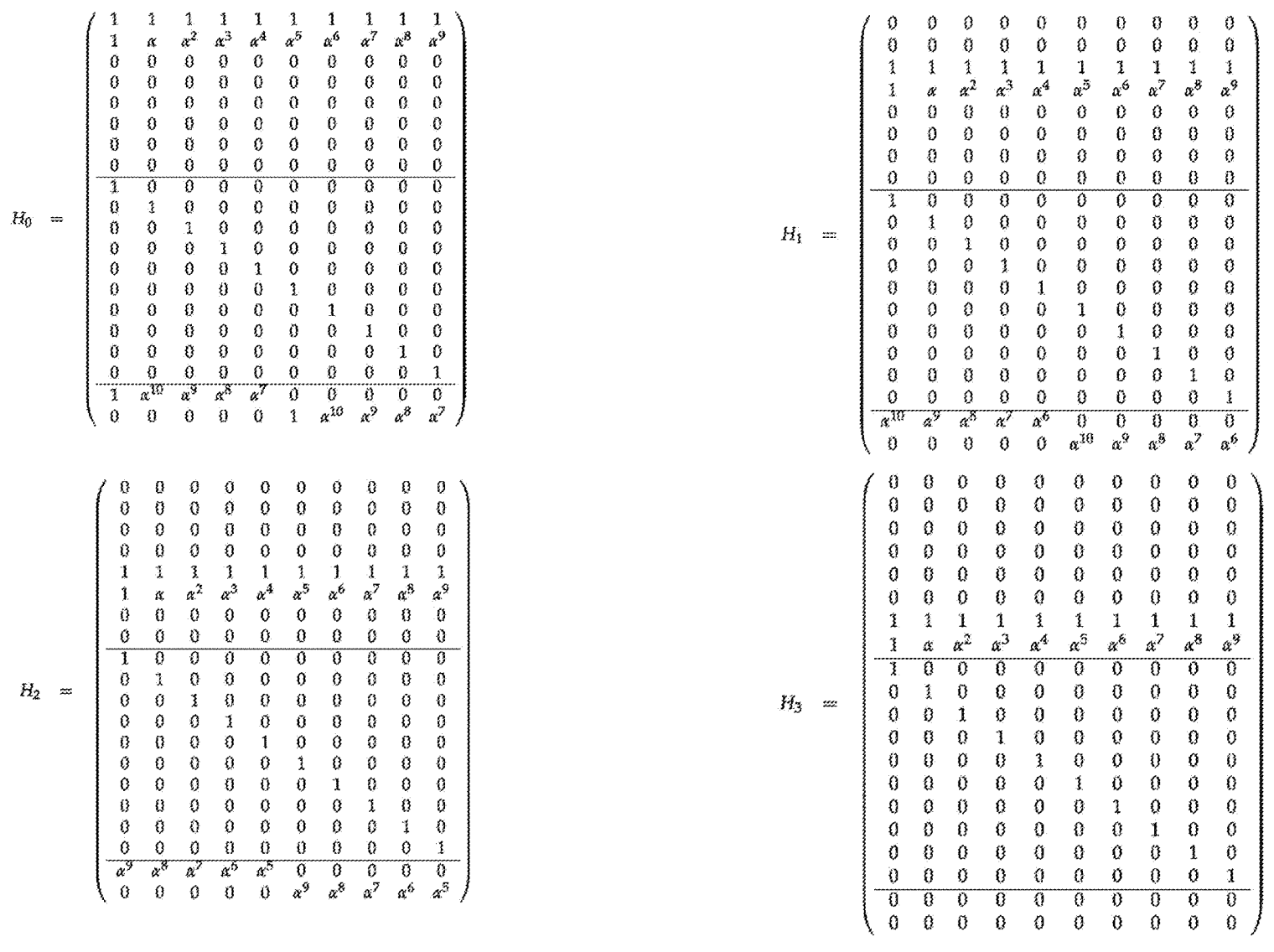

Example 9: Consider the ring $R_{11}$. Take 4×10 arrays, $\ell$ =2 and let $\alpha$ be a rotation in $R_{11}$. Then, according to FIG. 8, the 18×40 parity-check matrix of code $C^{(2)}$ (4, 10, 2, 11) is given by $H_{4,10,2,11}^{(2)}$=$H_0H_1H_2H_3$, where the matrices are depicted in FIG. 9. The following theorem gives the minimum distance of code $C^{(2)}$(m, n, $\ell$, p):

Theorem 10: The code $C^{(2)}$ (m, n, $\ell$, p) consisting of m×n arrays over $R_p^{(0)}$ whose parity-check matrix is given by FIG. 8, has minimum distance 8, where max{m−1, t}≤p and n= $\ell$ t.

Proof: Proving the above theorem requires proving that any 7 erasures are going to be corrected. Assume that up to 7 erasures have occurred. Without loss of generality, one may assume that no row contains one or two erasures nor no column contains exactly one erasure, otherwise such erasures would be corrected by either the horizontal or the vertical code, and no set of t consecutive columns contains exactly two erasures, otherwise such erasures are corrected by Lemma 4. So, without loss of generality, assume that there are 6 erasures in the same set of t consecutive columns. Specifically, assume that such erasures are in locations ($i_0$, $j_0$), ($i_0$, $j_1$), ($i_0$, $j_2$), ($i_1$, $j_0$), ($i_1$, $j_1$) and ($i_1$, $j_2$), where 0≤$i_0$<$i_1$≤m−1, 0≤$j_0$−st<$j_1$−st<$j_2$−st≤t−1 and 0≤s≤$\ell$ −1, as illustrated in FIG. 10. Assume first that 1≤$i_1$≤m−2. Then, one must solve the system:

$$a_{i_0,j_0} \oplus a_{i_0,j_1} \oplus a_{i_0,j_2} = S_{0,i_0}^{(H)} \quad (26)$$

$$a_{i_1,j_0} \oplus a_{i_1,j_1} \oplus a_{i_1,j_2} = S_{0,i_1}^{(H)} \quad (27)$$

$$\alpha^{j_0} a_{i_1,j_0} \oplus \alpha^{j_1} a_{i_1,j_1} \oplus \alpha^{j_2} a_{i_1,j_2} = S_{1,i_1}^{(H)} \quad (28)$$

$$a_{i_0,j_0} \oplus a_{i_1,j_0} = S_{j_0}^{(V)} \quad (29)$$

$$a_{i_0,j_1} \oplus a_{i_1,j_1} = S_{j_1}^{(V)} \quad (30)$$

$$\alpha^{-i_0-(j_0-st)} a_{i_0,j_0} \oplus \alpha^{-i_0-(j_1-st)} a_{i_0,j_1} \oplus \alpha^{-i_0-(j_2-st)} a_{i_0,j_2} \oplus \alpha^{-i_1-(j_0-st)} a_{i_1,j_0} \oplus \alpha^{-i_1-(j_1-s)} * a_{i_1,j_1} \oplus \alpha^{-i_1-(j_2-st)} a_{i_1,j_2} = S_s^{(L)} \quad (31)$$

where, assuming that the six erased entries $a_{i_u,j_v}$ are zero, by FIG. 8, $$S_{0,i}^{(H)} = \bigoplus_{v=0}^{n-1} a_{i,v} \quad (32)$$

$$S_{1,i}^{(H)} = \bigoplus_{v=0}^{n-1} \alpha^v a_{i,v} \quad (33)$$

$$S_j^{(V)} = \bigoplus_{u=0}^{m-1} a_{u,j} \quad (34)$$

$$S_s^{(L)} = \bigoplus_{u=0}^{m-2} \bigoplus_{v=0}^{t-1} \alpha^{-u-v} a_{u,st+j} \quad (35)$$

Rewriting (26), (27), (28), (29), (30), and (31), yields $$a_{i_0,j_0} \oplus a_{i_0,j_1} \oplus a_{i_0,j_2} = S_{0,i_0}^{(H)}$$

$$a_{i_0,j_0} \oplus a_{i_1,j_0} = S_{j_0}^{(V)}$$

$$a_{i_0,j_0} \oplus \alpha^{-(j_1-j_0)} \oplus \alpha^{-(j_2-j_0)} a_{i_0,j_2} \oplus \alpha^{-(i_1-i_0)} a_{i_1,j_0} \oplus \alpha^{-(i_1-i_0)-(j_1-j_0)} a_{i_1,j_1} \oplus \alpha^{-(i_1-i_0)-(j_2-j_0)} a_{i_1,j_2} = \alpha^{i_0+(j_0-st)} S_s^{(L)}$$

$$a_{i_0,j_1} \oplus a_{i_1,j_1} = S_{j_1}^{(V)}$$

$$a_{i_1,j_0} \oplus a_{i_1,j_2} = S_{0,i_1}^{(H)}$$

$$a_{i_1,j_0} \oplus \alpha^{j_1-j_0} a_{i_1,j_1} \oplus \alpha^{j_2-j_0} a_{i_1,j_2} = \alpha^{-j_0} S_{1,i_1}^{(H)}$$

XORing the first and the second equations and the first and the third equations above yields:

$$a_{i_0,j_0} \oplus a_{i_0,j_1} \oplus a_{i_0,j_2} = S_{0,i_0}^{(H)}$$

$$a_{i_0,j_1} \oplus a_{i_1,j_1} = S_{j_1}^{(V)}$$

$$a_{i_0,j_1} \oplus a_{i_0,j_2} \oplus a_{i_1,j_0} = A$$

$$(1 \oplus \alpha^{-(j_1-j_0)}) a_{i_0,j_1} \oplus (1 \oplus \alpha^{-(j_2-j_0)}) a_{i_0,j_2} \oplus \alpha^{-(i_1-i_0)} a_{i_1,j_0} \oplus \alpha^{-(i_1-i_0)-(j_1-j_0)} a_{i_1,j_1} \oplus \alpha^{-(i_1-i_0)-(j_2-j_0)} a_{i_1,j_2} = B$$

$$a_{i_1,j_0} \oplus a_{i_1,j_1} \oplus a_{i_1,j_2} = S_{0,i_1}^{(H)}$$

$$a_{i_1,j_0} \oplus \alpha^{j_1-j_0} a_{i_1,j_1} \oplus \alpha^{j_2-j_0} a_{i_1,j_2} = \alpha^{-j_0} S_{1,i_1}^{(H)}$$

where $$A = S_{0,i_0}^{(H)} \oplus S_{j_0}^{(V)} \quad (36)$$

$$B = S_{0,i_0}^{(H)} \oplus \alpha^{i_0+(j_0-st)} S_s^{(L)} \quad (37)$$

Replacing the third equation by the XOR of the second and third equations, and the fourth equation by the XOR of the second equation multiplied by $1 \oplus \alpha^{-(j_1-j_0)}$ and the fourth equation yields:

$$a_{i_0,j_0} \oplus a_{i_0,j_1} \oplus a_{i_0,j_2} = S_{0,i_0}^{(H)}$$

$$a_{i_0,j_1} \oplus a_{i_1,j_1} = S_{j_1}^{(V)}$$

$$a_{i_0,j_2} \oplus a_{i_1,j_0} \oplus a_{i_1,j_1} = C$$

$$(1 \oplus \alpha^{-(j_2-j_0)}) a_{i_0,j_2} \oplus \alpha^{-i_1-i_0} a_{i_1,j_0} \oplus (1 \oplus \alpha^{-(j_1-j_0)}) \oplus \alpha^{-(i_1-i_0)-(j_1-j_0)} a_{i_1,j_1} \oplus \alpha^{-(i_1-i_0)-(j_2-j_0)} a_{i_1,j_2} = D$$

$$a_{i_1,j_0} \oplus a_{i_1,j_1} \oplus a_{i_1,j_2} = S_{0,i_1}^{(H)}$$

$$a_{i_1,j_0} \oplus \alpha^{j_1-j_0} a_{i_1,j_1} \oplus \alpha^{j_2-j_0} a_{i_1,j_2} = \alpha^{-j_0} = S_{1,i_1}^{(H)}$$

where $$C = S_{j_1}^{(V)} \oplus A \quad (38)$$

$$D = (1 \oplus \alpha^{-(j_1-j_0)}) S_{j_1}^{(V)} \oplus B \quad (39)$$

Replacing the fourth equation by the XOR of the third equation multiplied by $1\oplus\alpha^{-(j2-j0)}$ with the fourth equation, and the sixth equation by the XOR of the fifth and the sixth equations and reordering the equations yields $$a_{i0,j0}\oplus a_{i0,j1}\oplus a_{i0,j2}=S_{0,i0}^{(H)}$$

$$a_{i0,j1}\oplus a_{i1,j1}=S_{j1}^{(V)}$$

$$a_{i0,j2}\oplus a_{i1,j0}\oplus a_{i1,j1}=C$$

$$a_{i1,j0}\oplus a_{i1,j1}\oplus a_{i1,j2}=S_{0,i1}^{(H)}$$

$$a_{i1,j0}\oplus\alpha^{j1-j0}a_{i1,j1}\oplus\alpha^{j2-j0}a_{i1,j2}=\alpha^{-j0}S_{1,i1}^{(H)}$$

$$(1\oplus\alpha^{-(j2-j0)}\oplus\alpha^{-(i1-i0)}a_{i1,j0}\oplus(\alpha^{-(j1-j0)}\oplus\alpha^{-(j2-j0)}$$
$$\oplus\alpha^{-(i1-i0)-(j1-j0)})a_{i1,j1}\oplus\alpha^{-(i1-i0)-(j2-j0)}a_{i1,j2}=(E)$$

$$(1\oplus\alpha^{j1-j0})a_{i1,j1}\oplus(1\oplus\alpha^{j2-j0})a_{i1,j2}=F$$

where $$E=(1\oplus\alpha^{-(j2-j0)})C\oplus D \quad (40)$$

$$F=S_{0,i1}^{(H)}\oplus\alpha^{-j0}S_{1,i1}^{(H)} \quad (41)$$

Replacing the fifth equation by the XOR of the fourth equation multiplied by $1\oplus\alpha^{-(j2-j0)}\oplus\alpha^{-(i1-i0)}$ with the fifth equation gives $$a_{i0,j0}\oplus a_{i0,j1}\oplus a_{i0,j2}=S_{0,i0}^{(H)}$$

$$a_{i0,j1}\oplus a_{i1,j1}=S_{j1}^{(V)}$$

$$a_{i0,j2}\oplus a_{i1,j0}\oplus a_{i1,j1}=C$$

$$a_{i1,j0}\oplus a_{i1,j1}\oplus a_{i1,j2}=S_{0,i1}^{(H)}$$

$$(1\oplus\alpha^{-(j1-j0)}\oplus\alpha^{-(i1-i0)}\oplus\alpha^{-(i1-i0)-(j1-j0)})a_{i1,j1}$$
$$\oplus(1\oplus\alpha^{-(j2-j0)}\oplus\alpha^{-(i1-i0)}\oplus\alpha^{-(i1-i0)-(j2-j0)})$$
$$a_{i1,j2}=G$$

$$(1\oplus\alpha^{j1-j0})a_{a1,j1}\oplus(1\oplus\alpha^{j2-j0})a_{i1,j2}=F$$

where $$G=(1\oplus\alpha^{-(j2-j0)}\oplus\alpha^{-(i1-i0)})S_{0,i1}^{(H)}\oplus E. \quad (42)$$

Flipping the last two equations and executing some factorization yields $$a_{i0,j0}\oplus a_{i0,j1}\oplus a_{i0,j2}=S_{0,i0}^{(H)}$$

$$a_{i0,j1}\oplus a_{i1,j1}=S_{j1}^{(V)}$$

$$a_{i0,j2}\oplus a_{i1,j0}\oplus a_{i1,j1}=C$$

$$a_{i1,j0}\oplus a_{i1,j1}\oplus a_{i1,j2}=S_{0,i1}^{(H)}$$

$$(1\oplus\alpha^{j1-j0})a_{i1,j1}\oplus(1\oplus\alpha^{j2-j0})a_{i1,j2}=F$$

$$(1\oplus\alpha^{j1-j0})(1\oplus\alpha^{-(i1-i0)})a_{i1,j1}\oplus\alpha^{-(j2-j1)}(1\oplus\alpha^{j2-j0})$$
$$(1\oplus\alpha^{-(i1-i0)})a_{i1,j2}=\alpha^{j1-j0}G$$

Replacing the last equation by the XOR of the fifth equation multiplied by $1\oplus\alpha^{-(i1-i0)}$ with the last equation yields $$a_{i0,j0}\oplus a_{i0,j1}\oplus a_{i0,j2}=S_{0,i0}^{(H)} \quad (43)$$

$$a_{i0,j1}\oplus a_{i1,j1}=S_{j1}^{(V)} \quad (44)$$

$$a_{i0,j2}\oplus a_{i1,j0}\oplus a_{i1,j1}=C \quad (45)$$

$$a_{i1,j0}\oplus a_{i1,j1}\oplus a_{i1,j2}=S_{0,i1}^{(H)} \quad (46)$$

$$(1\oplus\alpha^{j1-j0})a_{i1,j1}\oplus(1\oplus\alpha^{j2-j0})a_{i1,j2}=F \quad (47)$$

$$(1\oplus\alpha^{-(i1-i0)})(1\oplus\alpha^{j2-j0})(1\oplus\alpha^{-(j2-j1)})a_{i1,j2}=H \quad (48)$$

where $$H=(1\oplus\alpha^{-(i1-i0)})F\oplus\alpha^{j1-j0}G \quad (49)$$

Notice that $a_{i1,j2}$ can be obtained from (48) by applying three times the recursion of Lemma 4. Then $a_{i1,j1}$ is obtained from (47) and the already obtained value of $a_{i1,j2}$ applying the recursion of Lemma 4. The remaining values of $a_{i0,j0}$, $a_{i0,j1}$, $a_{i0,j2}$ and $a_{i1,j0}$, are obtained from (43), (44), (45) and (46), which involves XORs of the required values with previously obtained values. Thus, any six erasures can be corrected. Assume next that $i_1=m-1$. Now the following system must be solved.

$$a_{i0,j0}\oplus a_{i0,j1}\oplus a_{i0,j2}=S_{0,i0}^{(H)}$$

$$a_{m-1,j0}\oplus a_{m-1,j1}\oplus a_{m-1,j2}=S_{0,m-1}^{(H)}$$

$$\alpha^{j0}a_{m-1,j0}\oplus\alpha^{j1}a_{m-1,j1}\oplus\alpha^{j2}a_{m-1,j2}=S_{1,m-1}^{(H)}$$

$$a_{i0,j0}\oplus a_{m-1,j0}=S_{j0}^{(V)}$$

$$a_{i0,j1}\oplus a_{m-1,j1}=S_{j1}^{(V)}$$

$$\alpha^{-i0-(j0-st)}a_{i0,j0}\oplus\alpha^{-i0-(j1-st)}a_{i0,j1}\oplus\alpha^{-i0-(j2-st)}a_{i0,j2}=S_s^{(L)}$$

Assume that the six erased entries $a_{iu,jv}$ are zero, by (25), the syndromes $S_{0,i}^{(H)}$, $S_{1,i}^{(H)}$, $S_j^{(V)}$ and $S_s^{(L)}$ are given by (32), (33), (34) and (35) respectively. Rewriting (26), (27), (28), (29), (30) and (50) yields $$a_{i0,j0}\oplus a_{i0,j1}\oplus a_{i0,j2}=S_{0,i0}^{(H)}$$

$$a_{i0,j0}\oplus a_{m-1,j0}=S_{j0}^{(V)}$$

$$a_{i0,j0}\oplus\alpha^{-(j1-j0)}a_{i0,j1}\oplus\alpha^{-(j2-j0)}a_{i0,j2}=\alpha^{i0+(j0-st)}S_s^{(L)}$$

$$a_{i0,j1}\oplus a_{m-1,j1}=S_{j1}^{(V)}$$

$$a_{m-1,j0}\oplus a_{m-1,j1}\oplus a_{m-1,j2}=S_{0,m-1}^{(H)}$$

$$a_{m-1,j0}\oplus\alpha^{j1-j0}a_{m-1,j1}\oplus\alpha^{j2-j0}a_{m-1,j2}=\alpha^{-j0}S_{1,m-1}^{(H)}$$

XORing the first and second equations and the first and third equations above yields $$a_{i0,j0}\oplus a_{i0,j1}\oplus a_{i0,j2}=S_{0,i0}^{(H)}$$

$$a_{i0,j1}\oplus a_{m-1,j1}=S_{j1}^{(V)}$$

$$a_{i0,j1}\oplus a_{i0,j2}\oplus a_{m-1,j0}=A$$

$$(1\oplus\alpha^{-(j1-j0)})a_{i0,j1}\oplus(1\oplus\alpha^{-(j2-j0)})a_{i0,j2}=B$$

$$a_{m-1,j0}\oplus a_{m-1,j1}\oplus a_{m-1,j2}=S_{0,m-1}^{(H)}$$

$$a_{m-1,j0}\oplus\alpha^{j1-j0}a_{m-1,j1}\oplus\alpha^{j2-j0}a_{m-1,j2}=\alpha^{-j0}S_{1,m-1}^{(H)}$$

where A is given by (36) and B by (37). Replacing the third equation by the XOR of the second and third equations, and the fourth equation by the XOR of the third equation multiplied by $1\oplus\alpha^{-(j1-j0)}$ and the fourth equation yields $$a_{i0,j0}\oplus a_{i0,j1}\oplus a_{i0,j2}=S_{0,i0}^{(H)}$$

$$a_{i0,j1}\oplus a_{m-1,j1}=S_{j1}^{(V)}$$

$$a_{i0,j2}\oplus a_{m-1,j0}\oplus a_{m-1,j1}=C$$

$$(\alpha^{-(j1-j0)}\oplus\alpha^{-(j2-j0)})a_{i0,j2}\oplus(1\oplus\alpha^{-(j1-j0)})a_{m-1,j0}=D'$$

$$a_{m-1,j0} \oplus a_{m-1,j1} \oplus a_{m-1,j2} = S_{0,m-1}^{(H)}$$

$$a_{m-1,j0} \oplus \alpha^{j1-j0} a_{m-1,j1} \oplus \alpha^{j2-j0} a_{m-1,j2} = \alpha^{-j0} S_{1,m-1}^{(H)}$$

where C is given by (38) and D' is given by $$D' = (1 \oplus \alpha^{-(j1-j0)}) A \oplus B \quad (51)$$

Replacing the fourth equation by the XOR of the third equation multiplied by $\alpha^{-(j1-j0)} \oplus \alpha^{-(j2-j0)}$ with the fourth equation, and the sixth equation by the XOR of the fifth and the sixth equations and reordering the equations yields $$a_{i0,j0} \oplus a_{i0,j1} \oplus a_{i0,j2} = S_{0,i0}^{(H)}$$

$$a_{i0,j1} \oplus a_{m-1,j1} = S_{j1}^{(V)}$$

$$a_{i0,j2} \oplus a_{m-1,j0} \oplus a_{m-1,j1} = C$$

$$a_{m-1,j0} \oplus a_{m-1,j1} \oplus a_{m-1,j2} = S_{0,m-1}^{(H)}$$

$$(1 \oplus \alpha^{-(j2-j0)}) a_{m-1,j0} \oplus (\alpha^{-(j1-j0)} \oplus \alpha^{-(j2-j0)}) a_{m-1,j1} = E'$$

$$(1 \oplus \alpha_{j1-j0}) a_{m-1,j1} \oplus (1 \oplus \alpha^{j2-j0}) a_{m-1,j2} = F$$

where F is given by (41) and E' is given by $$E' = (\alpha^{-(j1-j0)} \oplus \alpha^{-(j2-j0)}) C \oplus D' \quad (52)$$

Replacing the fifth equation by the XOR of the fourth equation multiplied by $1 \oplus \alpha^{-(j2-j0)}$ with the fifth equation gives $$a_{i0,j0} \oplus a_{i0,j1} \oplus a_{i0,j2} = S_{0,i0}^{(H)}$$

$$a_{i0,j1} \oplus a_{m-1,j1} = S_{j1}^{(V)}$$

$$a_{i0,j2} \oplus a_{m-1,j0} \oplus a_{m-1,j1} = C$$

$$a_{m-1,j0} \oplus a_{m-1,j1} \oplus a_{m-1,j2} = S_{0,m-1}^{(H)}$$

$$(1 \oplus \alpha^{-(j1-j0)}) a_{m-1,j1} \oplus (1 \oplus \alpha^{-(j2-j0)}) a_{m-1,j2} = G'$$

$$(1 \oplus \alpha^{j1-j0}) a_{m-1,j1} \oplus (1 \oplus \alpha^{j2-j0}) a_{m-1,j2} = F$$

where G' is given by $$G' = (1 \oplus \alpha^{-(j2-j0)}) S_{0,m-1}^{(H)} \oplus E'$$

Flipping the last two equations and doing some factorization yields $$a_{i0,j0} \oplus a_{i0,j1} \oplus a_{i0,j2} = S_{0,i0}^{(H)}$$

$$a_{i0,j1} \oplus a_{m-1,j1} = S_{j1}^{(V)}$$

$$a_{i0,j2} \oplus a_{m-1,j0} \oplus a_{m-1,j1} = C$$

$$a_{m-1,j0} \oplus a_{m-1,j1} \oplus a_{m-1,j2} = S_{0,m-1}^{(H)}$$

$$(1 \oplus \alpha^{j1-j0}) a_{m-1,j1} \oplus (1 \oplus \alpha^{j2-j0}) a_{m-1,j2} = F$$

$$(1 \oplus \alpha^{j1-j0}) a_{m-1,j1} \oplus \alpha^{-(j2-j1)}(1 \oplus \alpha^{j2-j0}) a_{m-1,j2} = \alpha^{j1-j0} G'$$

Replacing the last equation by the XOR of the fifth equation with the last equation yields $$a_{i0,j0} \oplus a_{i0,j1} \oplus a_{i0,j2} = S_{0,i0}^{(H)} \quad (54)$$

$$a_{i0,j1} \oplus a_{m-1,j1} = S_{j1}^{(V)} \quad (55)$$

$$a_{i0,j2} \oplus a_{m-1,j0} \oplus a_{m-1,j1} = C \quad (56)$$

$$a_{m-1,j0} \oplus a_{m-1,j1} \oplus a_{m-1,j2} = S_{0,m-1}^{(H)} \quad (57)$$

$$(1 \oplus \alpha^{j1-j0}) a_{m-1,j1} \oplus (1 \oplus \alpha^{j2-j0}) a_{m-1,j2} = F \quad (58)$$

$$(1 \oplus \alpha^{-(j2-j1)})(1 \oplus \alpha^{j2-j0}) a_{m-1,j2} = F \oplus \alpha^{j1-j0} G' \quad (59)$$

Notice that $a_{m-1,j2}$ can be obtained from (59) by applying twice the recursion of Lemma 4. Then $a_{m-1,j1}$ is obtained from (58) and the already obtained value of $a_{m-1,j2}$ by applying the recursion of Lemma 4. The remaining values of $a_{i0,j0}$, $a_{i0,j1}$, $a_{i0,j2}$ and $a_{m-1,j0}$, are obtained from (54), (55), (56) and (57), which involves XORs of the required values with previously obtained values. Thus, any six erasures can be corrected.

One may also use a modification of code $C^{(2)}(m, n, \ell, p)$. Define code $C'^{(2)}(m, n, \ell, p)$ by giving an $(m+2n+\ell) \times mn$ parity-check matrix over the ring $R_p$, where now $\max\{m, n\} \leq p$ (certainly $n<p$, since $n = \ell t$ and p is prime). Explicitly, the parity-check matrix of the $[mn, mn-m-2(n-1)-\ell]$ code is given by FIG. 11, also referred to as (60). As in the previous section, sometimes a smaller value for p can be used via $C'^{(2)}(m, n, \ell, p)$ rather than $C^{(2)}(m, n, \ell, p)$ since it may require a ring $R_p$ with a smaller value of p. Consider the following example to illustrate the construction of $C'^{(2)}(m, n, \ell, p)$.

Example 11: Consider the ring $R_{11}$. As in Example 9, take $4 \times 10$ arrays, $\ell = 2$, and let $\alpha$ be a rotation in $R_{11}$. Then, according to (60), the $18 \times 40$ parity-check matrix of code $C'^{(2)}(4, 10, 2, 11)$ is given by $H'_{4, 10, 2, 11}{}^{(2)} = (H_0 H_1 H_2 H'_3)$, where $H_i$ is like in Example 9 for $0 \leq i \leq 2$, and $H'_3$ is defined according to FIG. 12. Accordingly, a theorem similar to Theorem 10 is stated for $C'^{(2)}(m, n, \ell, p)$.

Theorem 12: The code $C'^{(2)}(m, n, \ell, p)$ consisting of $m \times n$ arrays over $R_p^{(0)}$ whose parity-check matrix is given by (60) has minimum distance 8, where $\max\{m, n\} \leq p$ and $n = \ell t$.

A decoding algorithm exists for code $C'^{(2)}(m, n, \ell, p)$ similar to the decoding algorithm 8 described with respect to $C^{(1)}(m, n, \ell, p)$.

Algorithm 13 (Decoding Algorithm for code $C'^{(2)}(m, n, \ell, p)$: Consider code $C'^{(2)}(m, n, \ell, p)$. Assume that an array $(a_{i,j})$ for $0 \leq i \leq m-1$, $0 \leq j \leq n-1$ in $C'^{(2)}(m, n, \ell, p)$ is received, possibly containing erasures. If there are no erasures, then output $(a_{i,j})$ for $0 \leq i \leq m-1$, $0 \leq j \leq n-1$ and go to EXIT, otherwise make $j \leftarrow 0$ and $c \leftarrow mn$.

FIRST RESPONDER: If the number of erasures in entries $a_{i,j}$, $0 \leq i \leq m-1$, is different from one, then go to NEXT1. Otherwise, assuming that entry $a_{i0,j}$ has been erased, make $$a_{i0,j} \oplus \bigoplus_{\substack{i=0 \\ i \neq i0}}^{m-1} a_{i,j}$$

NEXT1: Make $j \leftarrow j+1$. If $j<n$ then go to FIRST RESPONDER. If $j=n$ and there are no erasures left, then output $(a_{i,j})$ for $0 \leq i \leq m-1$, $0 \leq j \leq n-1$ and go to EXIT. Otherwise make $u \leftarrow 0$.

SECOND RESPONDER: If there are either no columns with erasures or at least two columns with erasures in columns $ut+j$, $0 \leq j \leq t-1$, then go to NEXT2. Otherwise, assume that the column with erasures is column $ut+j_0$, where $0 \leq j_0 \leq t-1$. If column $ut+j_0$ contains more than two erasures. Then go to NEXT2. Otherwise, assume that there are two erasures in entries $a_{i0,ut+j0}$ and $a_{i1,ut+j0}$, where $0 \leq i_0 < i_1 \leq m-1$ and $0 \leq j_0 \leq t-1$, and the remaining entries $a_{i,ut+j}$ are erasure free. Assuming $a_{i0,ut+j0} = 0$ and $a_{i1,ut+j0} = 0$, compute the syndromes $S_{u,j0}^{(V)}$ as given by (19) and $S_u^{(L)}$ as given by (20). If $i_1 < m-1$, then obtain $a_{i0,ut+j0}$ by solving the recursion $$(1 \oplus \alpha^{i1-i0}) a_{i1,ut+j0} = \alpha^{i1-i0} S_{u,j0}^{(V)} \oplus \alpha^{i1+j0} S_u^{(L)}$$

given by Lemma 2, and then obtain $a_{i0,ut+j0}$ as $$a_{i0,ut+j0} = a_{i1,ut+j0} \oplus S_{u,j0}^{(V)}$$

while if $i_1=m-1$, make $$a_{i0,ut+j0}=\alpha^{i0+j0}S_u^{(L)}$$

$$a_{m-1,ut+j0}=a_{i0,ut+j0}\oplus S_{u,j0}^{(V)}$$

NEXT2: Make $u \leftarrow u+1$. If $u < \ell$ then go to SECOND RESPONDER. If $u=\ell$ and there are no erasures left, then output $(a_{i,j})$ for $0 \leq i \leq m-1$, $0 \leq j \leq n-1$ and go to EXIT. Otherwise, make $i \leftarrow 0$ and go to THIRD RESPONDER.

THIRD RESPONDER: If row i has either no erasures or more than two erasures, then go to NEXT3. If there is only one erasure in entry $a_{i,js}$, where $0 \leq j_s \leq n-1$, then make $$a_{i,js} \overset{n-1}{\underset{\substack{j=0 \\ j \neq js}}{\oplus}} a_{i,j}$$

and go to NEXT3. If there are exactly two erasures in entries $a_{i,ut+j0}$ and $a_{i,ut+j1}$, where $0 \leq u \leq \ell -1$ and $0 \leq j_0 < j_1 \leq t-1$, then, assuming both erased entries are equal to zero, compute the syndromes $S_{0,i}^{(H)}$ from (32) and $s_{1,i}^{(H)}$ from (33). Obtain $a_{i,j1}$ by solving the recursion $$(1 \oplus \alpha^{j1-j0})a_{i,j1}=S_{0,i}^{(H)} \oplus \alpha^{-<j0>t}S_{1,i}^{(H)}$$

by applying Lemma 2, and then obtain $$a_{a,j0}=a_{i,j1} \oplus S_{0,i}^{(H)}$$

NEXT3: Make $i \leftarrow i+1$. If $i<m$ then go to THIRD RESPONDER. Otherwise, if there are no more erasures, then output $(a_{i,j})$ for $0 \leq i \leq m-1$, $0 \leq j \leq n-1$ and go to EXIT. If there are erasures left, let $c_0$ be the number of such erasures. If $c_0<c$, then make $c \leftarrow c_0$, $j \leftarrow 0$ and go to FIRST RESPONDER. Otherwise, if $c_0 \neq 6$, then declare an uncorrectable erasure pattern and go to EXIT.

FOURTH RESPONDER: Assume that the erasures occurred in entries $a_{i0,j0}$, $a_{i0,j1}$, $a_{i0,j2}$, $a_{i1,j1}$, $a_{i1,j1}$, and $a_{i1,j2}$, where $0 \leq i_0 < i_1 \leq m-1$, $0 \leq u \leq \ell -1$ and $0 \leq j_0 - ut < j_1 - ut < j_2 - ut \leq t-1$. Making these locations equal to zero, compute the syndromes $S_{0,i0}^{(H)}$, $S_{0,i1}^{(H)}$, $S_{1,i1}^{(H)}$, $S_{j0}^{(V)}$, $S_{j1}^{(V)}$ and $S_u^{(L)}$, where $S_{0,i}^{(H)}$ is given by (32), $S_{1,i}^{(H)}$ by (33), $S_j^{(V)}$ by (34), $S_u^{(L)}$ by (35), A from (36), B from (37), C from (38) and F from (41). If $i_1<m-1$, then compute D from (39), E from (40), G from (42) and H from (49). Obtain $a_{i1,j2}$ solving the triple recursion $$(1 \oplus \alpha^{-(i1-i0)})(1 \oplus \alpha^{j2-j0})(1 \oplus \alpha^{-(j2-j1)})a_{i1,j2}=H$$

by applying Lemma 2, $a_{i1,j1}$ solving the recursion $$(1 \oplus \alpha^{j1-j0})a_{i1,j1}=F \oplus (1 \oplus \alpha^{j2-j0})a_{i1,j2}$$

again by Lemma 2, then obtain $$a_{i1,j0}=S_{0,i1}^{(H)} \oplus a_{i1,j1} \oplus a_{i1,j2}$$

$$a_{i0,j2}=C \oplus a_{i1,j0} \oplus a_{i1,j1}$$

$$a_{i0,j1}=S_{j1}^{(V)} \oplus a_{i1,j1}$$

$$a_{i0,j0}=S_{0,i0}^{(H)} \oplus a_{i0,j1} \oplus a_{i0,j2}$$

Output $(a_{i,j})$ for $0 \leq i \leq m-1$, $0 \leq j \leq n-1$ and go to EXIT.

If $i=m-1$, then compute D' from (51), E' from (52) and G' from (53). Obtain $a_{m-1,j2}$, by solving the double recursion $$(1 \oplus \alpha^{-(j2-j1)})(1 \oplus \alpha^{j2-j0})a_{m-1,j2}=F \oplus \alpha^{j1-j0}G'$$

$a_{m-1,j1}$ solving the recursion $$(1 \oplus \alpha^{j1-j0})a_{m-1,j1}=F \oplus (1 \oplus \alpha^{j2-j0})a_{m-1,j2}$$

and $$a_{m-1,j0}=S_{0,m-1}^{(H)} \oplus a_{m-1,j1} \oplus a_{m-1,j2}$$

$$a_{i0,j2}=C \oplus a_{m-1,j0} \oplus a_{m-1,j1}$$

$$a_{i0,j1}=S_{j1}^{(V)} \oplus a_{m-1,j1}$$

$$a_{i0,j0}=S_{0,i0}^{(H)} \oplus a_{i0,j1} \oplus a_{i0,j2}$$

Output $(a_{i,j})$ for $0 \leq i \leq m-1$, $0 \leq j \leq n-1$; EXIT.

Note that the decoding algorithm for code $C'^{(2)}(m, n, \ell, p)$ is similar but simpler than the one of $C^{(2)}(m, n, \ell, p)$ as given by Decoding Algorithm 13, since there is no need to distinguish between the cases $i_1<m-1$ and $i_1=m-1$ by the second and the fourth responders.

IV. Hierarchical Construction Combining the Previous Two

In this section, we consider a number of w m×n arrays such that each array is encoded according to code $C^{(1)}(m, n, \ell, p)$ of Section II. In addition, a column parity is added to one of the w arrays that is shared among all the arrays. That second shared column parity, that is similar to the one of code $C^{(2)}(m, n, \ell, p)$ of Section III, allows for correction of 7 erasures anywhere, i.e., the minimum distance of the code is 8, like $C^{(2)}(m, n, \ell, p)$. The code is illustrated in FIG. 14, where S stands for shared parity.

Given w m×n arrays with $n=\ell t$ and max $\{m,t\} \leq p$, let the $[mnw, w((m-1)(n-1)-\ell)-m+1]$ code $C(w, m, n, \ell, p)$ be given by the $[w(m+n+\ell)+m, wmn]$ parity-check matrix depicted with respect to FIG. 13, also referred to as (61), where $H_{m, n, \ell, p}^{(1)}$ is given by (1) in FIG. 1D. As discussed in Sections II and III, w+1 of the rows of matrix $H_{w, m, \ell, p}$ are linearly dependent. Again the construction is illustrated by the following example.

Example 14: As in Example 9, consider the ring $R_{11}$. Take 3×8 arrays, w=3 and let $\alpha$ be a rotation on vectors of length 11. Then, according to (61), the parity-check matrix of code C(3, 3, 8, 2, 11) is given by the 42×72 matrix (four of the rows are linearly dependent, so C(3, 3, 8, 2, 11) is a [72, 34] code). Consider matrix $H_{3, 3, 8, 2, 11}$ depicted with respect to FIG. 15, wherein $H_{3, 3, 8, 2, 11}$ is similar to the 13×24 matrix given in Example 1 (the difference being that in Example 1, m=4 and p=5, while here, m=3 and p=11), $0_{i,j}$ is an i×j zero matrix and H is the 3×24 matrix depicted with respect to FIG. 16. The following theorem gives the minimum distance of code $C(w, m, n, \ell, p)$.

Theorem 15: The code $C(w, m, n, \ell, p)$ whose parity-check matrix is given by (61) in FIG. 13, consisting of w m×n arrays over $R_p^{(0)}$, where $n=\ell t$ and max$\{m, n\} \leq p$, has minimum distance 8.

Proof: Assume that 7 erasures have occurred. There are w m×n arrays such that each array belongs in code $C^{(1)}(m, n, \ell, p)$ as given in Section II. If the 7 erasures occur in two different arrays, one of them has at most 3 erasures. Such 3 erasures can be corrected since code $C^{(1)}(m, n, \ell, p)$ has minimum distance 6 by Theorem 5. So, we may assume that all 7 erasures have occurred in the same array. But in this case, we can use the global parities given by the last m rows of $H_{w, m, n, \ell, p}$ as given by (61), and any corresponding 7×7 submatrix has rank 7, as shown in Theorem 10.

Algorithm 16 (Decoding Algorithm for code $C(w, m, n, \ell, p)$): Assume that an array $a_{i,j}^{(u)}$—is received, where $0 \leq u \leq w-1$, $0 \leq i < m-1$, $0 \leq j \leq n-1$, and $n = \ell t$ such that some of the entries have possibly been erased, the array corresponding to an array in code $C(w, m, n, \ell, p)$ given by parity-check matrix wherein $H_{w,m,n,\ell,p}$ is defined by (61). Then, proceed as follows to correct the erasures:

START: If there are no erasures, then output $a_{i,j}^{(u)}$, $0 \leq u \leq w-1$, $0 \leq i \leq m-1$ and $0 \leq j \leq n-1$, and go to EXIT. Otherwise, make $u \leftarrow 0$.

DECODING IN $C^{(1)}(m, n, \ell, p)$: Correct all possible erasures in array $a_{i,j}^{(u)}$ using Algorithm 8. Make $u \leftarrow u+1$. If $u < w$, then go to DECODING IN $C^{(1)}(m, n, \ell, p)$. Otherwise, if there are no erasures left, output $a_{i,j}^{(u)}$, $0 \leq u \leq w-1$, $0 \leq i \leq m-1$ and $0 \leq j \leq n-1$ and go to EXIT. If there are erasures remaining, make $i \leftarrow 0$ and $c \leftarrow 0$.

NEXT: If $a_{i,j}^{(u)}$, $0 \leq u \leq w-1$, $0 \leq j \leq n-1$, contains either no erasures or more than two erasures, then go to JUMP. Otherwise, make $c \leftarrow 1$ ($c=1$ indicates that at least two erasures are corrected in this process) and assume that the two erased entries are $a_{i,j0}^{(u)}$ and $a_{i,j1}^{(u)}$ for some $u$, $j_0$ and $j_1$, where $0 \leq u \leq w-1$ and $0 \leq j_0 \leq j_1 \leq n-1$. Compute the horizontal syndromes $$S_i^{(H),u} = \bigoplus_{j=0}^{n-1} a_{i,j}^{(u)} \quad (62)$$

$$S_i^{(S)} = \bigoplus_{u=0}^{w-1} \bigoplus_{j=0}^{n-1} \alpha^j a_{i,j}^{(u)} \quad (63)$$

Obtain $a_{i,j1}^{(u)}$ by solving the recursion $$(1 \oplus \alpha^{j1-j0}) a_{i,j1}^{(u)} = S_i^{(H),u} \oplus \alpha^{-j0} S_i^{(S)}$$

by applying Lemma 2, and then obtain $$a_{i,j0}^{(u)} = a_{i,j1}^{(u)} \oplus S_i^{(H),u}$$

JUMP: Make $i \leftarrow i+1$. If $i=m$, then go to MAIN. Otherwise, go to NEXT.

MAIN: If there are no erasures left, then output $a_{i,j}^{(u)}$, $0 \leq u \leq w-1$, $0 \leq i \leq m-1$ and $0 \leq j \leq n-1$, and go to EXIT. If $c=1$, then go to START. If $c=0$ and there are more than six erasures, declare an uncorrectable error and go to EXIT. Otherwise assume that the six erased entries are $a_{i_0,j_0}^{(u)}$, $a_{i_0,j_1}^{(u)}$, $a_{i_0,j_2}^{(u)}$, $a_{i_1,j_1}^{(u)}$, $a_{i_1,j_1}^{(u)}$ and $a_{i_1,j_2}^{(u)}$, where $0 \leq u \leq w-1$, $0 \leq i_0 < i_1 \leq m-1$, $0 \leq s \leq \ell$ 1 and $0 \leq j_0 - st < j_1 - st < j_2 - st \leq t-1$. Making these locations equal to zero, compute the syndromes $S_{i_0}^{(H),u}$ and $S_{i_1}^{(H),u}$ as given by (62), $S_i^{(s)}$ as given by (63), $S_{i_0}^{(V),u}$ and $S_{j_1}^{(V),u}$ as given by $$S_j^{(V),u} = \bigoplus_{i=0}^{m-1} a_{i,j}^{(u)} \quad (64)$$

$S_s^{(L),u}$ as given by $$S_s^{(L),u} = \bigoplus_{i=0}^{m-2} \bigoplus_{j=0}^{t-1} \alpha^{-j} a_{i,st+j}^{(u)} \quad (65)$$

and A, B, C, and F as $$A = S_{i_0}^{(H),u} \oplus S_{j_0}^{(V),u}$$

$$B = S_{i_0}^{(H),u} \oplus \alpha^{i_0+(j_0-st)} S_s^{(L),u}$$

$$C = S_{j_1}^{(V),u} \oplus A$$

$$F = S_{i_1}^{(H),u} \oplus \alpha^{-(j_0-st)} S_{i_1}^{S}$$

If $i_1 < m-1$, then compute D, E, G and H as $$D = (1 \oplus \alpha^{-(j_1-j_0)}) S_{j_1}^{(V),u} \oplus B$$

$$E = (1 \oplus \alpha^{-(j_2-j_0)}) C \oplus D$$

$$G = (1 \oplus \alpha^{-(j_2-j_0)} \oplus \alpha^{-(i_1-i_0)}) S_{i_1}^{(H),u} \oplus E$$

$$H = (1 \oplus \alpha^{-(i_1-i_0)}) F \oplus \alpha^{j_1-j_0} G.$$

Obtain $a_{i_1,j_2}^{(u)}$ solving the triple recursion $$(1 \oplus \alpha^{-(i_1-i_0)})(1 \oplus \alpha^{j_2-j_0})(1 \oplus \alpha^{-(j_2-j_1)}) a_{i_1,j_2}^{(u)} = H$$

by applying Lemma 2, $a_{i_1,j_1}^{(u)}$ solving the recursion $$(1 \oplus \alpha^{j_1-j_0}) a_{i_1,j_1}^{(u)} = F \oplus (1 \oplus \alpha^{j_2-j_0}) a_{i_1,j_2}^{(u)}$$

again by Lemma 2, then obtain $$a_{i_1,j_0}^{(u)} = S_{i_1}^{(H),u} \oplus a_{i_1,j_1}^{(u)} \oplus a_{i_1,j_2}^{(u)}$$

$$a_{i_0,j_2}^{(u)} = C \oplus a_{i_1,j_0}^{(u)} \oplus a_{i_1,j_1}^{(u)}$$

$$a_{i_0,j_1}^{(u)} = S_{j_1}^{(V),u} \oplus a_{i_1,j_1}^{(u)}$$

$$a_{i_0,j_0}^{(u)} = S_{i_0}^{(H),u} \oplus a_{i_0,j_1}^{(u)} \oplus a_{i_0,j_2}^{(u)}$$

Output $a_{a,j}^{(u)}$, $0 \leq u \leq w-1$, $0 \leq i \leq m-1$ and $0 \leq j \leq n-1$ and go to EXIT.

If $i_1 = m-1$, then compute D', E', and G' as $$D' = (1 \oplus \alpha^{-(j_1-j_0)}) A \oplus B$$

$$E' = (\alpha^{-(j_1-j_0)} \oplus \alpha^{-(j_2-j_0)}) C \oplus D'$$

$$G' = (1 \oplus \alpha^{-(j_2-j_0)}) S_{m-1}^{(H)u} \oplus E'$$

Where A is given by (66), B by (67) and C by (68).

Obtain $a_{m-1,j_2}^{(u)}$ by solving the double recursion $$(1 \oplus \alpha^{-(j_2-j_1)})(1 \alpha \alpha^{j_2-j_0}) a_{m-1,j_2}^{(u)} = F \oplus \alpha^{j_1-j_0} G'$$

Similarly, obtain $a_{m-1,j_1}^{(u)}$ by solving the recursion $$(1 \oplus \alpha^{j_1-j_0}) a_{m-1,j_1}^{(u)} = F \oplus (1 \oplus \alpha^{j_2-j_0}) a_{m-1,j_2}^{(u)}$$

and $$a_{m-1,j_0}^{(u)} = S_{0,m-1}^{(H)} \oplus a_{m-1,j_1}^{(u)} \oplus a_{m-1,j_2}^{(u)}$$

$$a_{i_0,j_2}^{(u)} = C \oplus a_{m-1,j_0}^{(u)} \oplus a_{m-1,j_1}^{(u)}$$

$$a_{i_0,j_1}^{(u)} = S_{j_1}^{(V)} \oplus a_{m-1,j_1}^{(u)}$$

$$a_{i_0,j_0}^{(u)} = S_{0,i_0}^{(H)} \oplus a_{i_0,j_1}^{(u)} \oplus a_{i_0,j_2}^{(u)}$$

Output $a_{a,j}^{(u)}$, $0 \leq u \leq w-1$, $0 \leq i \leq m-1$ and $0 \leq j \leq n-1$; EXIT.

As was done previously with codes $C^{(1)}(m, n, \ell, p)$ and $C^{(2)}(m, n, \ell, p)$, code $C(w, m, n, \ell, p)$ can be modified to obtain code $C'(w, m, n, \ell, p)$ as given by the [w(m+n+$\ell$)+m, wmn] parity-check matrix depicted with respect to FIG. 17 (also referred to as (77)). The decoding algorithm for code $C'(w, m, n, \ell, p)$ is similar to the decoding algorithm for code $C(w, m, n, \ell, p)$ as given by Algorithm 16, except that $C'^{(1)}(m, n, \ell, p)$ is decoded first instead of $C^{(1)}(m, n, \ell, p)$, and in step MAIN of the algorithm, the case $i_1 = p-1$ is treated as the case $i_1 < p-1$.

V. Puncturing the Constructions

Given a prime number p, let g(x) be a binary polynomial such that g(x) divides $1 \oplus x^p$ and $\gcd(1 \oplus x, g(x)) = 1$. Denote by $C(p, g(x)(1 \oplus x))$ the binary cyclic code of length p whose generator polynomial is $g(x)(1 \oplus x)$. Recall that $R_p$ is the ring of binary polynomials modulo $1 \oplus x^p$ and let $\alpha \in R_p$ such that $\alpha^p=1$ and $\alpha \neq 1$. Essentially, given w m×n arrays with n=ℓ t and max{m, t}≤p, let the [mnw, w ((m−1)(n−1)−ℓ)−m+1] code C(w, m, n, ℓ, p, g(x)) be given by the [w(m+n+ℓ)+m, wmn] parity-check matrix (61) in FIG. 13, where the elements in the code are in the cyclic code C(p, g(x)(1⊕x)). Notice, that, in particular, code C(w, m, n, ℓ, p) as defined in Section IV corresponds to the special case g(x)=1. Similar definitions are valid for the codes $C^{(1)}$(m, n, ℓ, p) and $C^{(2)}$(m, n, ℓ, p) respectively. The obtained codes are denoted $C^{(1)}$(m, n, ℓ, p, g(x)) and $C^{(2)}$(m, n, ℓ, p, g(x)). The following example illustrates the new definition.

Example 17: Let p=17 and $g(x)=1+x+x^2+x^4+x^6+x^7+x^8$. We can verify that g(x) divides $1+x^{17}$ and gcd(g(x), 1+x)=1. Also, $g(x)(1+x)=1+x^3+x^4+x^5+x^6+x^9$. Consider the code C(3, 6, 10, 2, 17, g(x)). Considering encoding the 3 arrays depicted with respect to FIG. 18 into C(3, 6, 10, 2, 17, g(x)).

Here, each decimal number i, $0 \leq i \leq 2^{17}-1=131071$ represents a 17-bit vector. For example, 112515 represents the 17-bit vector (11011011110000011) (least significant bits are at the right). This vector can be written in the polynomial form: $1+x+x^3+x^4+x^6+x^7+x^8+x^9+x^{15}+x^{16}=(1+x+x^2+x^4+x^6+X^7+x^8)(1+x)(1+x+x^4+x^6+x^7)$, hence, this polynomial is a multiple of g(x)(1+x). The same is true of all the entries different from $2^{17}$.

The number $2^{17}=131072$ represents an erasure. Encoding the array of FIG. 18 in C(3, 6, 10, 2, 17, g(x)) by applying Algorithm 16 yields the arrays depicted in FIG. 19. Any one of the recovered erased entries can be proven to be a multiple of g(x)(1+x), since when decoding, only XORs and rotations of vectors in the cyclic code C(p, g(x)(1+x)) are executed.

Consider the arrays depicted in FIG. 20. In the first of these three arrays, one column has been erased; in the second of these three arrays, two columns have been erased; and in the third of these three arrays, one column has been erased. Every non-erased column has generally one erasure, although in some cases, there are two erasures. Applying Algorithm 16 again to these arrays yields the three encoded arrays depicted in FIG. 19.

A puncturing of a code of length n in s specified locations is a code of length n−s such that the s specified entries in each codeword of the original code are deleted; it was shown how to puncture expanded Blaum-Roth codes, and the same method can be applied to puncture the constructions of Sections II, III and IV.

Puncturing the code C(w, m, n, ℓ, p, g(x)) is executed as follows: for each entry in each array in C(w, m, n, ℓ, p, g(x)), which is a vector of length p, take the first p deg(g(x)) 1 bits in the vector. Denote the obtained punctured code by PC(w, m, n, ℓ, p, g(x)). Similarly, punctured versions of $C^{(1)}$(m, n, ℓ, p, g(x)) (denoted $PC^{(1)}$(m, n, ℓ, p, g(x))) and of $C^{(2)}$(m, n, ℓ, p, g(x)) (denoted $PC^{(2)}$(m, n, ℓ, p, g(x))) can be obtained. The puncturing process is illustrated with respect to the following example.

Example 18: Consider PC(3, 6, 10, 2, 17, g(x)), where g(x) is the same as in Example 17. By puncturing the 3 arrays in C(3, 6, 10, 2, 17, g(x)) of Example 17 depicted in FIG. 19 by taking the first 8 bits in each entry, the three arrays depicted in FIG. 21 are obtained.

Here each entry is represented by a number i, $0 \leq i \leq 255$, corresponding to a binary vector of length 8. Take for example entry (0,0) of the first array in FIG. 19, which is the number 124541. The corresponding vector of length 17 is 11110011001111101, whose puncturing corresponds to the first 8 bits of this vector, i.e., 11110011. The decimal number corresponding to this 8-bit vector is 243, which is entry (0,0) of the first array in FIG. 21. The same is true of all the entries in the arrays.

In a C(w, m, n, ℓ, p) code, each entry is an even weight vector, hence, it can tolerate up to one erased symbol in the entry. A C(w, m, n, ℓ, p, g(x)) code expands upon this concept: each entry is a multiple of g(x)(1+x), i.e., it is in the C(p, g(x)(1+x)) code, which has a certain minimum distance d. Hence, up to d−1 erased symbols in each entry can be corrected by the code, giving an extra level of locality. For example, in examples 17 and 18, it can be verified that the cyclic code C(17, g(x)(1+x)) has minimum distance 6, hence, up to 5 erased symbols can be corrected in each entry.

Regarding the punctured PC(w, m, n, ℓ, p, g(x)) code, the polynomial g(x) can be regarded as a CRC polynomial. In this case, it is used to detect erased symbols in the traditional way a CRC code is used, i.e., the remainder of dividing a received polynomial by g(x) is computed. If such a remainder is not zero, then an error in the received polynomial is detected and the whole polynomial is considered as an erased symbol. When encoding, the CRC symbols are computed only for the data symbols, while the parity symbols inherit automatically the CRC symbols as part of the encoding process. This property makes implementation much easier.

Figure 22:
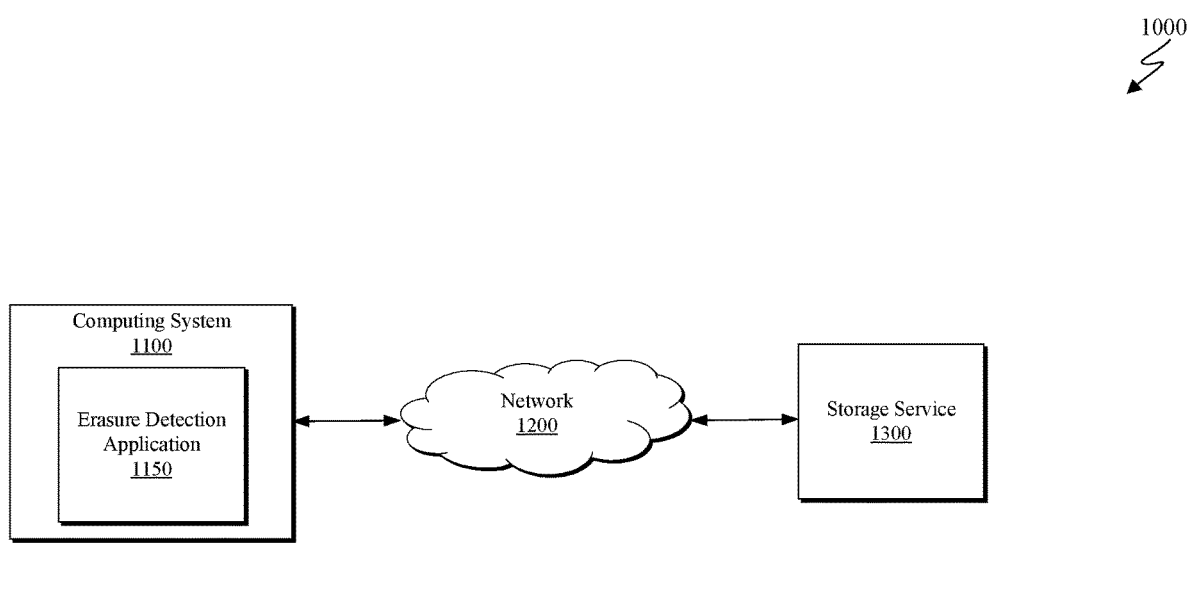
FIG. 22 is a block diagram depicting an erasure recovery system in accordance with at least one embodiment of the present invention.

FIG. 22 is a block diagram depicting an erasure recovery system 1000 in accordance with at least one embodiment of the present invention. As depicted, erasure recovery system 1000 includes computing system 1100, network 1200, and storage service 1300. Erasure recovery system 1000 may enable the detection and recovery of various erasures within a storage architecture.

Computing system 1100 can be a desktop computer, a laptop computer, a specialized computer server, or any other computer system known in the art. In some embodiments, computing system 1100 represents computer systems utilizing clustered computers to act as a single pool of seamless resources. In general, computing system 1100 is representative of any electronic device, or combination of electronic devices, capable of receiving and transmitting data, as described in greater detail with regard to FIG. 6. Computing system 1100 may include internal and external hardware components, as depicted and described in further detail with respect to FIG. 24.

As depicted, computing system 1100 includes erasure detection application 1150. Erasure detection application 1150 may be configured to execute an erasure detection method, such as the one described with respect to FIG. 23. Erasure detection application 1150 may be capable of executing any of the operational steps detailed above or below.

Network 1200 can be, for example, a local area network (LAN), a wide area network (WAN) such as the Internet, or a combination of the two, and include wired, wireless, or fiber optics connections. In general, network 1200 can be any combination of connections and protocols that will support communications between computing system 1100 and storage service 1300.

Storage service 1300 stores received information and can be representative of one or more databases or other storage platforms that give permissioned access to erasure detection application 1150 or publicly available databases. In general, storage service 1300 can be implemented using any non-volatile storage media known in the art. For example, storage service 1300 can be implemented with a tape library, optical library, one or more independent hard disk drives, or multiple hard disk drives in a redundant array of independent disk (RAID).

Figure 23:
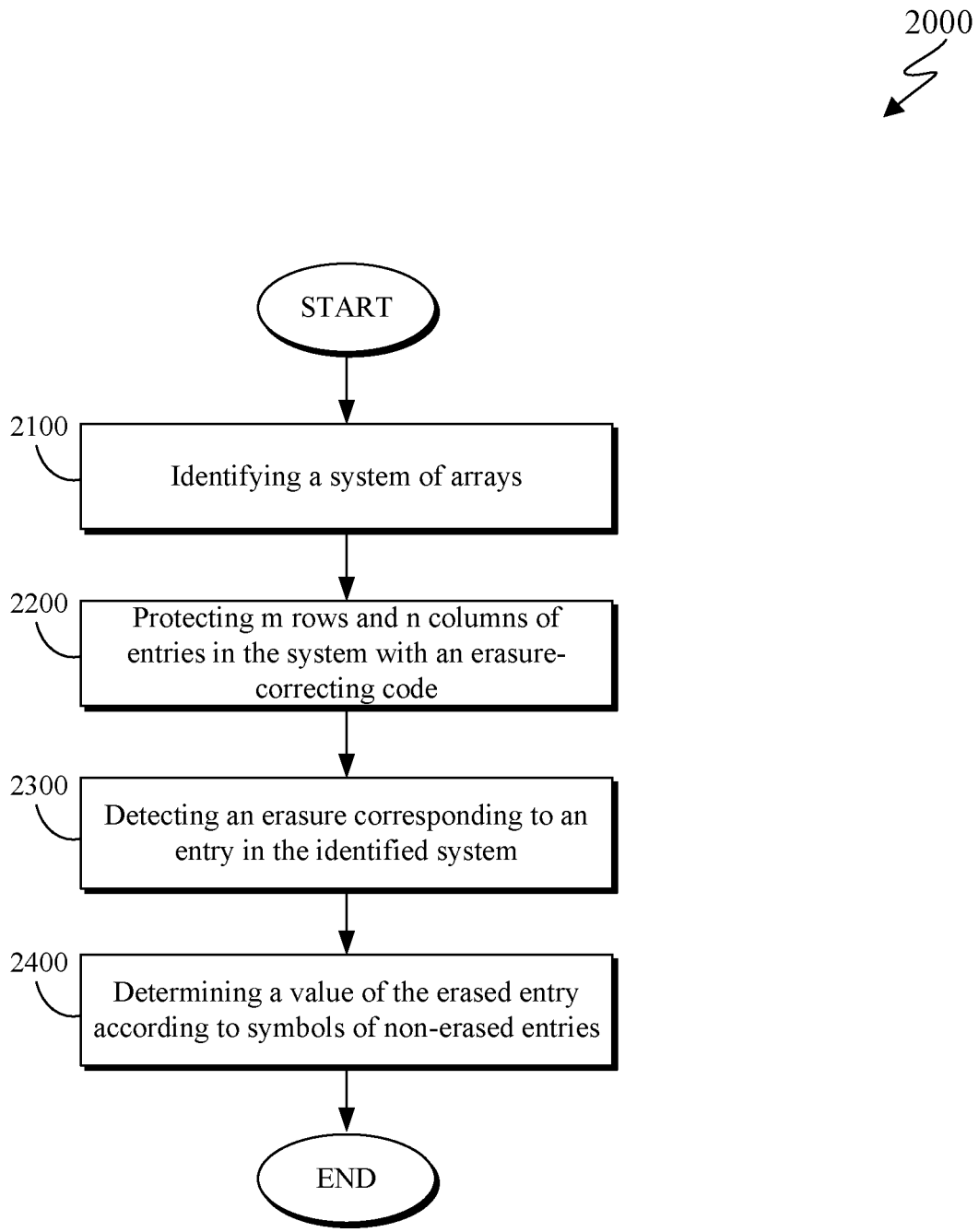
FIG. 23 is a flowchart depicting an erasure recovery method in accordance with at least one embodiment of the present invention.

FIG. 23 is a flowchart depicting an erasure detection method 2000 in accordance with at least one embodiment of the present invention. As depicted, erasure detection method 2000 includes identifying (2100) a system consisting of a plurality of arrays, wherein each array consists of m rows and n columns of entries, each entry is divided into p symbols consisting of a plurality of bits, and wherein each entry contains either data or parity only, protecting (2200) the m rows and n columns of entries in the system with an erasure-correcting code allowing the recovery of a number of erased entries in such rows and columns, detecting (2300) an erasure corresponding to an entry in the identified system, and responsive to detecting an erasure, determining (2400) the value of the erased entry according to the p symbols of one or more non-erased entries. In some embodiments of erasure detection method 2000, some of the parity units are shared among all the arrays. In some embodiments of erasure detection method 2000, the number of symbols p in each entry (or unit) is a prime number; in some cases, p is the largest prime number between m and n. In some embodiments of erasure detection method 2000, the p symbols in each unit are in a cyclic code with generator polynomial g(x)(1+x) and minimum distance d>2, where g(x) is a divisor of $x^p-1$. In some embodiments of erasure detection method 2000, each of the w arrays is divided into $\ell$ subarrays of m rows and t columns each, such subarrays containing extra parity units allowing for the recovery of extra erased units in addition to the ones recovered by the vertical parities in the subarray. In some embodiments of erasure detection method 2000, each row and each column in each array are protected by a single parity code. In some embodiments of erasure detection method 2000, each m×t subarray contains one extra parity unit. The additional parity unit may enable recovery of two erased units in one of the t columns of the subarray when the remaining t−1 columns in the subarray have at most one erased unit. In some embodiments of erasure detection method 2000, the mw rows in the w arrays are divided into m disjoint sets of w rows each, where each row in a set belongs in a different array and each set contains an extra parity unit that is shared among all w rows in the set; such an extra parity unit allows the recovery of two erased units in any of the w rows in the set provided that the remaining w−1 rows contain at most one erased unit. In at least some embodiments, the entries or units in the w arrays constitute an erasure correcting code with a minimum distance of 8. Erasure detection method 2000 may correspond to a hierarchical method for recovering erasures in each of the w arrays, in which first, up to d−1 units are recovered in one of the columns of each m×t subarray provided that the remaining t−1 columns contain no erased units, then up to one erased unit is recovered in each row of the array. The process described may be repeated iteratively until either all the erasures in each array have been recovered, or until no further erasures are recoverable. In some embodiments, erasure detection method 2000 includes recovering further erased units using shared parity units. Erasure detection method 2000 may additionally include declaring an unrecoverable pattern when erasures still remain. In some embodiments, erasure detection method 2000 includes, whenever a received unit is not in the CRC code after recovery of erased symbols has been done, declaring such unit as erased.

Figure 24:
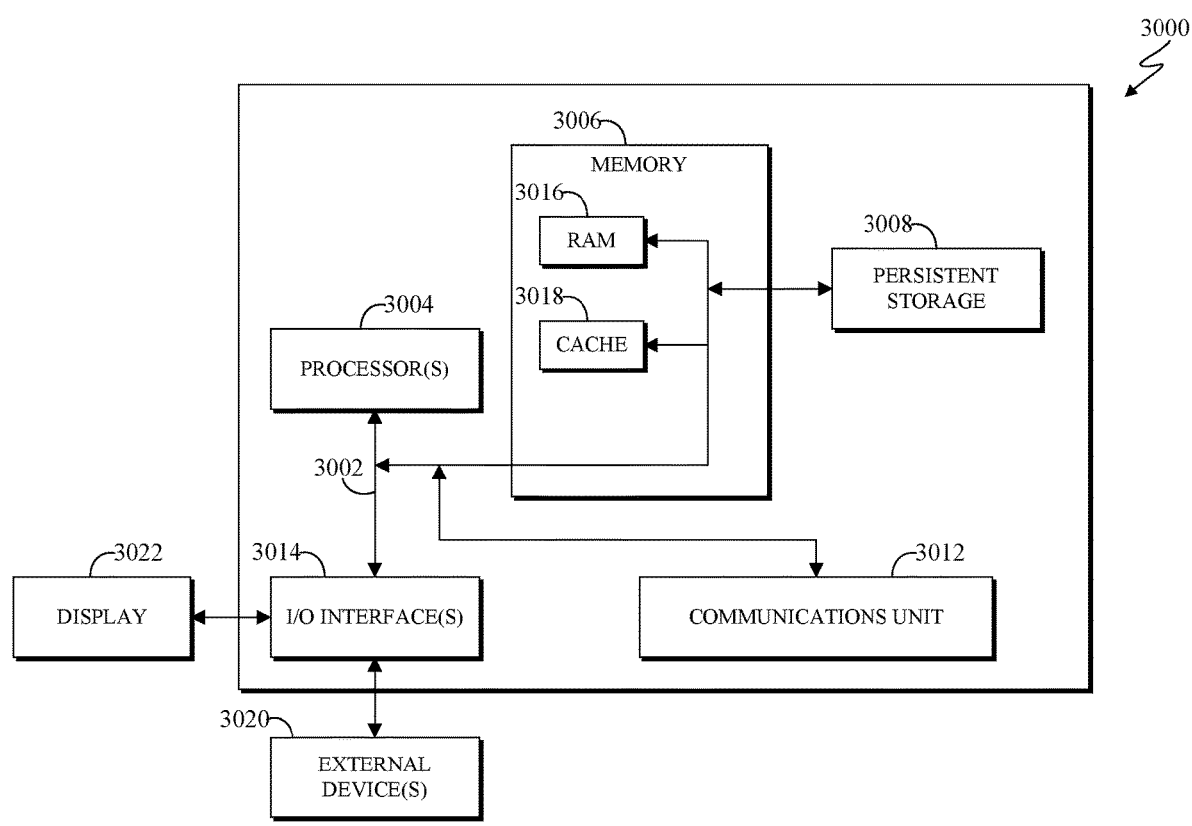
FIG. 24 is a block diagram of components of a computing system executing the image analysis system in accordance with an embodiment of the present invention.

FIG. 24 depicts a block diagram of components of computing system 110 in accordance with an illustrative embodiment of the present invention. It should be appreciated that FIG. 24 provides only an illustration of one implementation and does not imply any limitations with regard to the environments in which different embodiments may be implemented. Many modifications to the depicted environment may be made.

As depicted, the computer 3000 includes communications fabric 3002, which provides communications between computer processor(s) 3004, memory 3006, persistent storage 3008, communications unit 3012, and input/output (I/O) interface(s) 3014. Communications fabric 3002 can be implemented with any architecture designed for passing data and/or control information between processors (such as microprocessors, communications and network processors, etc.), system memory, peripheral devices, and any other hardware components within a system. For example, communications fabric 3002 can be implemented with one or more buses.

Memory 3006 and persistent storage 3008 are computer-readable storage media. In this embodiment, memory 3006 includes random access memory (RAM) 3016 and cache memory 3018. In general, memory 3006 can include any suitable volatile or non-volatile computer-readable storage media.

One or more programs may be stored in persistent storage 3008 for access and/or execution by one or more of the respective computer processors 3004 via one or more memories of memory 3006. In this embodiment, persistent storage 3008 includes a magnetic hard disk drive. Alternatively, or in addition to a magnetic hard disk drive, persistent storage 3008 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 3008 may also be removable. For example, a removable hard drive may be used for persistent storage 3008. Other examples include optical and magnetic disks, thumb drives, and smart cards that are inserted into a drive for transfer onto another computer-readable storage medium that is also part of persistent storage 3008.

Communications unit 3012, in these examples, provides for communications with other data processing systems or devices. In these examples, communications unit 3012 includes one or more network interface cards. Communications unit 3012 may provide communications through the use of either or both physical and wireless communications links.

I/O interface(s) 3014 allows for input and output of data with other devices that may be connected to computer 3000. For example, I/O interface 3014 may provide a connection to external devices 3020 such as a keyboard, keypad, a touch screen, and/or some other suitable input device. External devices 3020 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 3008 via I/O interface(s) 3014. I/O interface(s) 3014 also connect to a display 3022.

Display 3022 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for recovering erased entries within a system of arrays, the method comprising:
   identifying a system consisting of a plurality of arrays, wherein each array consists of m rows and n columns of entries, each entry is divided into p symbols consisting of a plurality of bits and wherein each symbol consists of either data or parity;
   protecting the m rows and n columns of the arrays in the system with an erasure-correcting code allowing the recovery of a number of erased entries in such rows and columns by assigning an even weight vector to each entry according to the erasure-correcting code;
   detecting an erased entry in the system; and
   responsive to detecting an erased entry, determining a value of the erased entry according to the p symbols and the assigned even weight vectors of one or more non-erased entries such that the determined value of the erased entry combined with the assigned even weight vector of the one or more non-erased entries yield an expected result according to the erasure-correcting code.

2. The computer implemented method of claim 1, wherein some entries consisting of parity only are shared among the plurality of arrays.

3. The computer implemented method of claim 1, wherein determining the value of a single erased entry in a row or a column of an array comprises executing an exclusive-OR of the non-erased entries in the row or column.

4. The computer implemented method of claim 3, wherein a first step to compute the values of a plurality of erased entries consists of determining the syndromes as the exclusive-OR of rotations of non-erased entries.

5. The computer implemented method of claim 1, wherein the exclusive-OR of the p symbols in an entry is equal to zero.

6. The computer implemented method of claim 5, wherein the number of symbols p in an entry is a prime number.

7. The computer implemented method of claim 6, wherein the entries are in a cyclic code of length p.

8. A computer program product for recovering erased entries within a system of arrays, the computer program product comprising:
   one or more computer readable storage media and program instructions stored on the one or more computer readable storage media, the program instructions comprising instructions to:
   identify a system consisting of a plurality of arrays, wherein each array consists of m rows and n columns of entries, each entry is divided into p symbols consisting of a plurality of bits and wherein each symbol consists of either data or parity;
   protect the m rows and n columns of the arrays in the system with an erasure-correcting code allowing the recovery of a number of erased entries in such rows and columns by assigning an even weight vector to each entry according to the erasure-correcting code;
   detect an erased entry in the system; and
   responsive to detecting an erased entry, determine a value of the erased entry according to the p symbols and the assigned even weight vectors of one or more non-erased entries such that the determined value of the erased entry combined with the assigned even weight vector of the one or more non-erased entries yield an expected result according to the erasure-correcting code.

9. The computer program product of claim 8, wherein some entries consisting of parity only are shared among the plurality of arrays.

10. The computer program product of claim 8, wherein instructions to determine the value of a single erased entry in a row or a column of an array comprise instructions to execute an exclusive-OR of the non-erased entries in the row or column.

11. The computer program product of claim 10, wherein a first step to compute the values of a plurality of erased entries consists of determining the syndromes as the exclusive-OR of rotations of non-erased entries.

12. The computer program product of claim 8, wherein the exclusive-OR of the p symbols in an entry is equal to zero.

13. The computer program product of claim 12, wherein the number of symbols p in an entry is a prime number.

14. The computer program product of claim 13, wherein the entries are in a cyclic code of length p.

15. A computer system for recovering erased entries within a system of arrays, the computer system comprising:
   one or more computer processors;
   one or more computer-readable storage media;
   program instructions stored on the computer-readable storage media for execution by at least one of the one or more processors, the program instructions comprising instructions to:
   identify a system consisting of a plurality of arrays, wherein each array consists of m rows and n columns of entries, each entry is divided into p symbols consisting of a plurality of bits and wherein each symbol consists of either data or parity;
   protect the m rows and n columns of the arrays in the system with an erasure-correcting code allowing the recovery of a number of erased entries in such rows and columns by assigning an even weight vector to each entry according to the erasure-correcting code;
   detect an erased entry in the system; and
   responsive to detecting an erased entry, determine a value of the erased entry according to the p symbols and the assigned even weight vectors of one or more non-erased entries such that the determined value of the erased entry combined with the assigned even weight vector of the one or more non-erased entries yield an expected result according to the erasure-correcting code.

16. The computer system of claim 15, wherein some entries consisting of parity only are shared among the plurality of arrays.

17. The computer system of claim 15, wherein instructions to determine the value of a single erased entry in a row or a column of an array comprise instructions to execute an exclusive-OR of the non-erased entries in the row or column.

18. The computer system of claim 17, wherein a first step to compute the values of a plurality of erased entries consists of determining the syndromes as the exclusive-OR of rotations of non-erased entries.

19. The computer system of claim 15, wherein the exclusive-OR of the p symbols in an entry is equal to zero.

20. The computer system of claim 19, wherein the number of symbols p in an entry is a prime number.

\* \* \* \* \*